(12) United States Patent
Eom

(10) Patent No.: US 11,923,406 B2
(45) Date of Patent: Mar. 5, 2024

(54) SEMICONDUCTOR DEVICE

(71) Applicant: SK hynix Inc., Icheon-si (KR)

(72) Inventor: Dae Sung Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 214 days.

(21) Appl. No.: 17/466,841

(22) Filed: Sep. 3, 2021

(65) Prior Publication Data

US 2022/0302248 A1    Sep. 22, 2022

(30) Foreign Application Priority Data

Mar. 18, 2021   (KR) ......................... 10-2021-0035531

(51) Int. Cl.
*H01L 23/522*   (2006.01)
*H01L 27/06*    (2006.01)
*H01L 49/02*    (2006.01)

(52) U.S. Cl.
CPC .......... *H01L 28/87* (2013.01); *H01L 23/5223* (2013.01); *H01L 23/5226* (2013.01); *H01L 27/0688* (2013.01)

(58) Field of Classification Search
CPC . H01L 28/87; H01L 23/5223; H01L 23/5226; H01L 27/0688

USPC ......................................................... 257/396
See application file for complete search history.

(56) References Cited

U.S. PATENT DOCUMENTS

2019/0341194 A1    11/2019  Carver et al.
2020/0350248 A1 *  11/2020  Park ..................... H01L 23/535

FOREIGN PATENT DOCUMENTS

KR    1020170004274 A    1/2017
KR    1020190057800 A    5/2019

* cited by examiner

*Primary Examiner* — Tu-Tu V Ho
(74) *Attorney, Agent, or Firm* — William Park & Associates Ltd.

(57) ABSTRACT

A semiconductor device includes: a first insulating layer, a plurality of first electrodes penetrating the first insulating layer, a plurality of second electrodes penetrating the first insulating layer, the plurality of second electrodes being located between the plurality of first electrodes: a first high dielectric constant layer having a dielectric constant higher than a dielectric constant of the first insulating layer, a plurality of third electrodes penetrating the first high dielectric constant layer, the plurality of third electrodes being respectively connected to the plurality of first electrodes, and a plurality of fourth electrodes penetrating the first high dielectric constant layer, the plurality of fourth electrodes being located between the plurality of third electrodes.

20 Claims, 27 Drawing Sheets

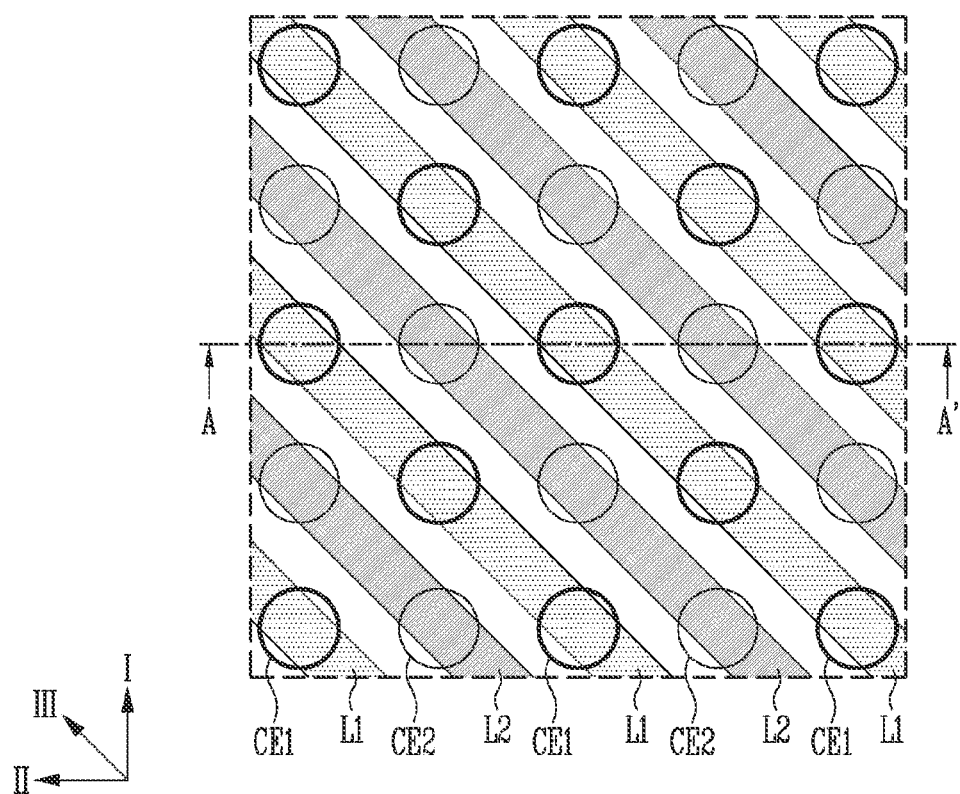

SEMICONDUCTOR DEVICE

CROSS-REFERENCE TO RELATED APPLICATION

The present application claims priority under 35 U.S.C. § 119(a) to Korean patent application number 10-2021-0035531 filed on Mar. 18, 2021, in the Korean Intellectual Property Office, the entire disclosure of which is incorporated by reference herein.

BACKGROUND

1. Technical Field

The present disclosure generally relates to an electronic device, and more particularly, to a semiconductor device and a manufacturing method of the semiconductor device.

2. Related Art

A degree of integration of a semiconductor device is mainly determined by an area occupied by a unit memory cell. As the improvement of the degree of integration of semiconductor devices in which memory cells are formed in the form of a single layer over a substrate reaches the limit, there has recently been proposed a three-dimensional semiconductor device in which memory cells are stacked over a substrate. Various structures and manufacturing methods have been developed to improve the operational reliability of the three-dimensional semiconductor device.

SUMMARY

In accordance with an aspect of the present disclosure, there may be provided a semiconductor device including: a first insulating layer, a plurality of first electrodes penetrating the first insulating layer, a plurality of second electrodes penetrating the first insulating layer, the plurality of second electrodes being located between the plurality of first electrodes: a first high dielectric constant layer having a dielectric constant higher than a dielectric constant of the first insulating layer, a plurality of third electrodes penetrating the first high dielectric constant layer, the plurality of third electrodes being respectively connected to the plurality of first electrodes, and a plurality of fourth electrodes penetrating the first high dielectric constant layer, the plurality of fourth electrodes being located between the plurality of third electrodes.

In accordance with another aspect of the present disclosure, there may be provided a semiconductor device including: a first high dielectric constant layer, a plurality of first electrodes penetrating the first high dielectric constant layer, a plurality of second electrodes penetrating the first high dielectric constant layer to a depth different from that of the plurality of first electrodes, a second high dielectric constant layer located on the first high dielectric constant layer, a plurality of third electrodes penetrating the second high dielectric constant layer, the plurality of third electrodes being electrically connected to the plurality of second electrodes, and a plurality of fourth electrodes penetrating the second high dielectric constant layer to a depth different from that of the plurality of third electrodes, the plurality of fourth electrodes being spaced apart from the plurality of first electrodes.

In accordance with another aspect of the present disclosure, there may be provided a semiconductor device including: a first insulating layer, a first electrode penetrating the first insulating layer, a second electrode penetrating the first insulating layer, the second electrode being adjacent the first electrode, a first high dielectric constant layer having a dielectric constant higher than a dielectric constant of the first insulating layer, a third electrode penetrating the first high dielectric constant layer, the third electrode being connected to the first electrode, and a fourth electrode penetrating the first high dielectric constant layer, the fourth electrode located adjacent the third electrode.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A, 1B, and 1C are views illustrating a structure of a semiconductor device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device having a stable structure and improved characteristics, and a manufacturing method of the semiconductor device.

Figure 1A:
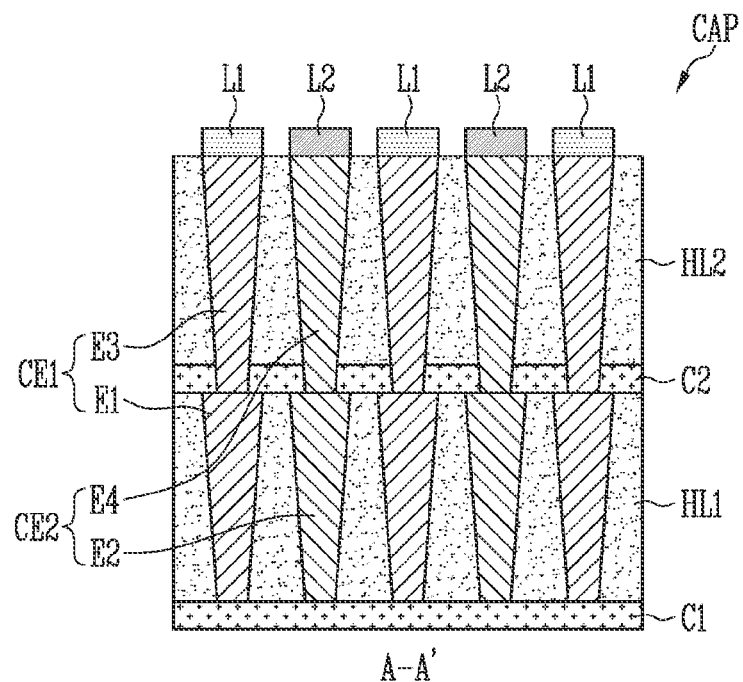
Figure 1C:
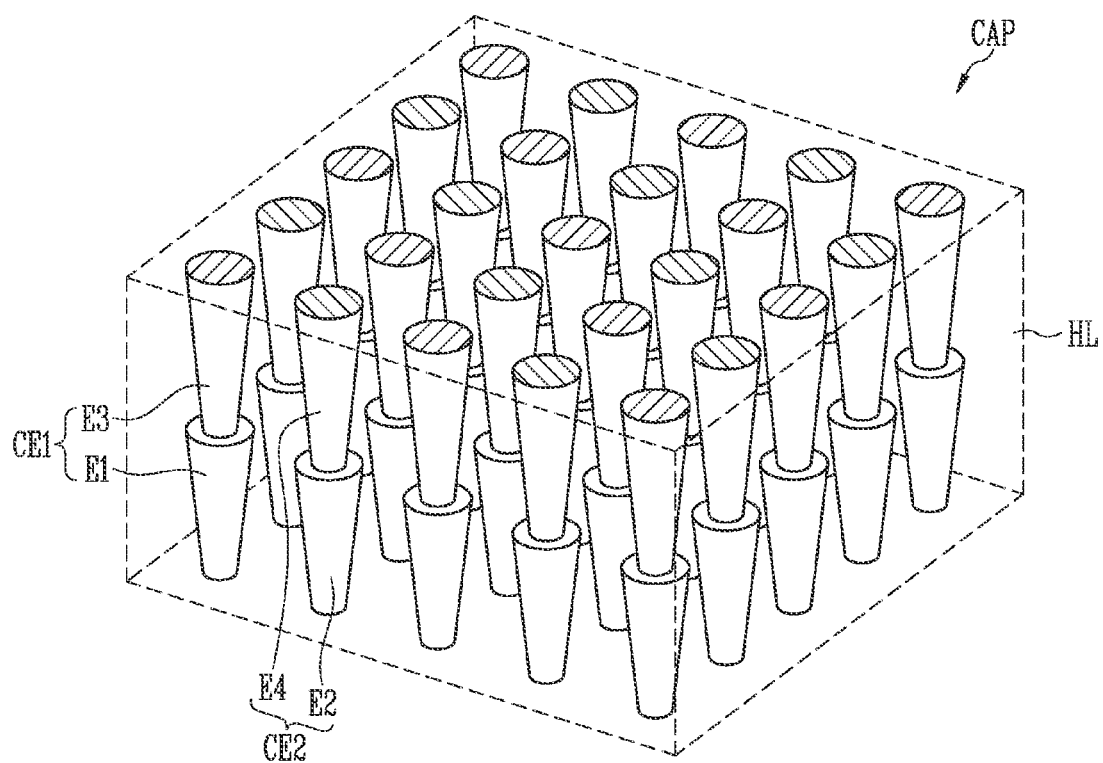

FIGS. 1A to 1C are views illustrating a structure of a semiconductor device in accordance with an embodiment of the present disclosure. FIG. 1B may be a layout of FIG. 1A, and FIG. 1A may be a sectional view taken along line A-A' shown in FIG. 1B.

Referring to FIGS. 1A to 1C, the semiconductor device may include a high dielectric constant layer HL, first electrodes E1, second electrodes E2, third electrodes E3, and fourth electrodes E4. The semiconductor device may further include a first capping layer C1, a second capping layer C2, first lines L1, or second lines L2, or further include a combination thereof.

The high dielectric constant layer HL may include a first high dielectric constant layer HL1 and a second high dielectric constant layer HL2. Each of the first high dielectric constant layer HL1 and the second high dielectric constant layer HL2 may include a high dielectric constant (high-k) material. The first high dielectric constant layer HL1 and the second high dielectric constant layer HL2 may include the same high dielectric constant material or include different high dielectric constant materials. The second high dielectric constant layer HL2 may be located on the top of the first high dielectric constant layer HL1.

The first electrodes E1 and the second electrodes E2 may penetrate the first high dielectric constant layer HL1. Each of the first electrodes E1 and the second electrodes E2 may have a pillar shape, and have a plane with a circular shape, an elliptical shape, a polygonal shape, or the like. The first electrodes E1 and the second electrodes E2 may be arranged in a first direction I and a second direction II intersecting the first direction I. In the first direction I, the first electrodes E1 and the second electrodes E2 may be alternately arranged. In the second direction II, the first electrodes E1 and the second electrodes E2 may be alternately arranged. In an embodiment, the first electrode E1 may be located adjacent the second electrode E2 as shown in FIG. 1A.

The first capping layer C1 may be located on the bottom of the first high dielectric constant layer HL1. The second capping layer C2 may be interposed between the first high dielectric constant layer HL1 and the second high dielectric constant layer HL2. The first capping layer C1 and the second capping layer C2 may minimize or prevent migration of a metal included in the first electrodes E1, the second electrodes E2, the third electrodes E3, or the fourth electrodes E4 to a peripheral layer. Also, the first capping layer C1 and the second capping layer C2 may be used as an etch stop layer in a manufacturing process of the semiconductor device. In an embodiment, the first capping layer C1 and the second capping layer C2 may include nitride.

The third electrodes E3 may be located corresponding to the first electrodes E1. The third electrodes E3 may penetrate the second high dielectric constant layer HL2, and be respectively connected to the first electrodes E1. When the second capping layer C2 is located between the first high dielectric constant layer HL1 and the second high dielectric constant layer HL2, the third electrodes E3 may penetrate the second capping layer C2.

The fourth electrodes E4 may be disposed between the third electrodes E3. The fourth electrodes E4 may be located corresponding to the second electrodes E2. The fourth electrodes E4 may penetrate the second high dielectric constant layer HL2, and be respectively connected to the second electrodes E2. When the second capping layer C2 is located between the first high dielectric constant layer HL1 and the second high dielectric constant layer HL2, the fourth electrodes E4 may penetrate the second capping layer C2.

The third electrode E3 and the fourth electrodes E4 may be arranged in the first direction I and the second direction II intersecting the first direction I. In the first direction I, the third electrode E3 and the fourth electrodes E4 may be alternately arranged. In the second direction II, the third electrodes E3 and the fourth electrodes E4 may be alternately arranged. In an embodiment, the third electrode E3 may be located adjacent the fourth electrode E4 as shown in FIG. 1A.

The first lines L1 may extend in a third direction III intersecting the first direction I and the second direction II. Each of the first lines L1 may electrically connect third electrodes E3 arranged in the third direction III. The second lines L2 may extend in the third direction III. Each of the second lines L2 may electrically connect fourth electrodes E4 arranged in the third direction III. The second lines L2 may be located between the first lines L1. The first lines L1 and the second lines L2 may be alternately arranged.

According to the structure described above, a first capacitor electrode CE1, a second capacitor electrode CE2, the first high dielectric constant layer HL1, and the second high dielectric constant layer HL2 may constitute one capacitor CAP. In an embodiment, as shown in FIGS. 1A to 1C, one or more first capacitor electrodes CE1, and one or more second capacitor electrodes CE2, the first high dielectric constant layer HL1, and the second high dielectric constant layer HL2 may constitute one capacitor CAP. The first capacitor electrode CE1 may include one of the first electrodes E1 and one of the third electrodes E3, which are electrically connected to each other. The second capacitor electrode CE2 may include one of the second electrodes E2 and one of the fourth electrodes E4, which are electrically connected to each other. For example, as shown in FIG. 1A, the first capacitor electrode CE1 includes the first electrode E1 and the third electrode E3, which are electrically connected to each other. For example, as shown in FIG. 1A, the second capacitor electrode includes the second electrode E2 and the fourth electrode E4, which are electrically connected to each other.

Since the capacitor CAP includes the first to fourth plug-type electrodes E1 to E4, the capacitance of the capacitor CAP can be further increased as compared with a capacitor including a line-type electrode, and a margin of a breakdown voltage can be secured. Also, since the capacitor CAP includes the first high dielectric constant layer HL1 and the second high dielectric constant layer HL2, the capacitance of the capacitor CAP can be increased as compared with a capacitor including no high dielectric constant layer.

Meanwhile, although a case where the capacitor CAP has a structure in which the first high dielectric constant layer HL1 and the second high dielectric constant layer HL2 are stacked as a double layer has been described in this embodiment, the present disclosure is not limited thereto. The capacitor CAP may include high dielectric constant layers stacked as a triple layer or higher.

Figure 2A:
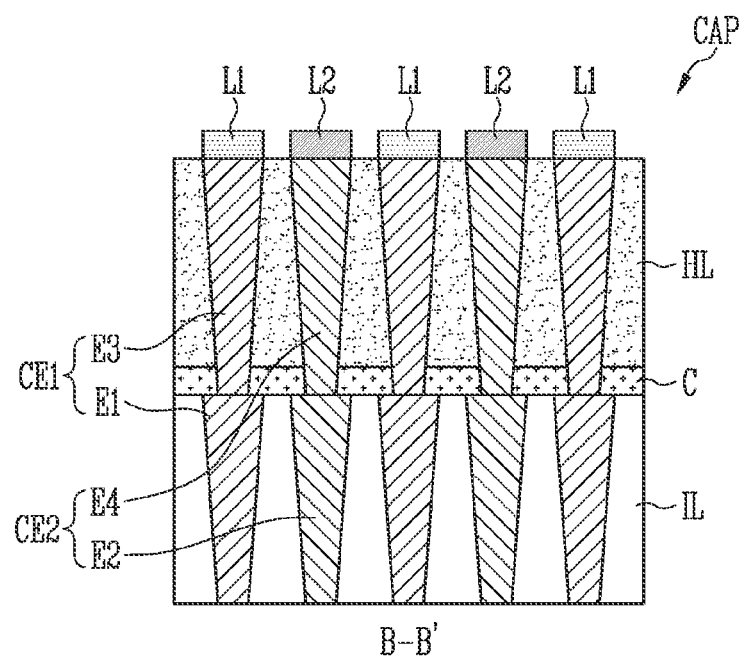
FIGS. 2A, 2B, and 2C are views illustrating a structure of a semiconductor device in accordance with an embodiment of the present disclosure.
Figure 2B:
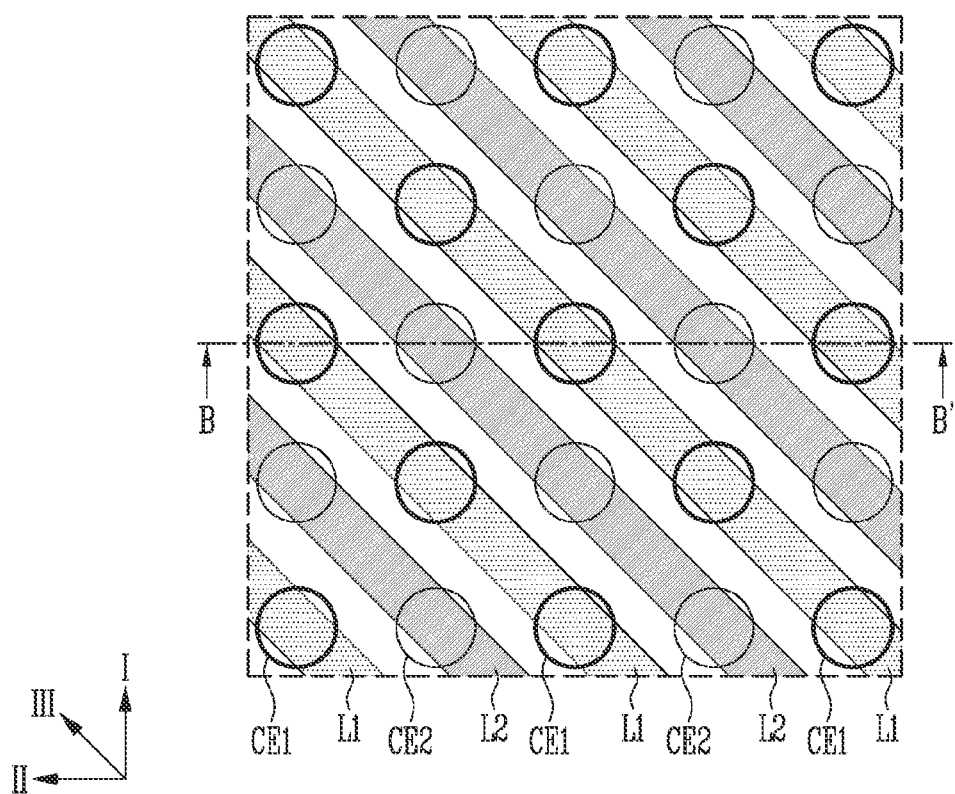
Figure 2C:
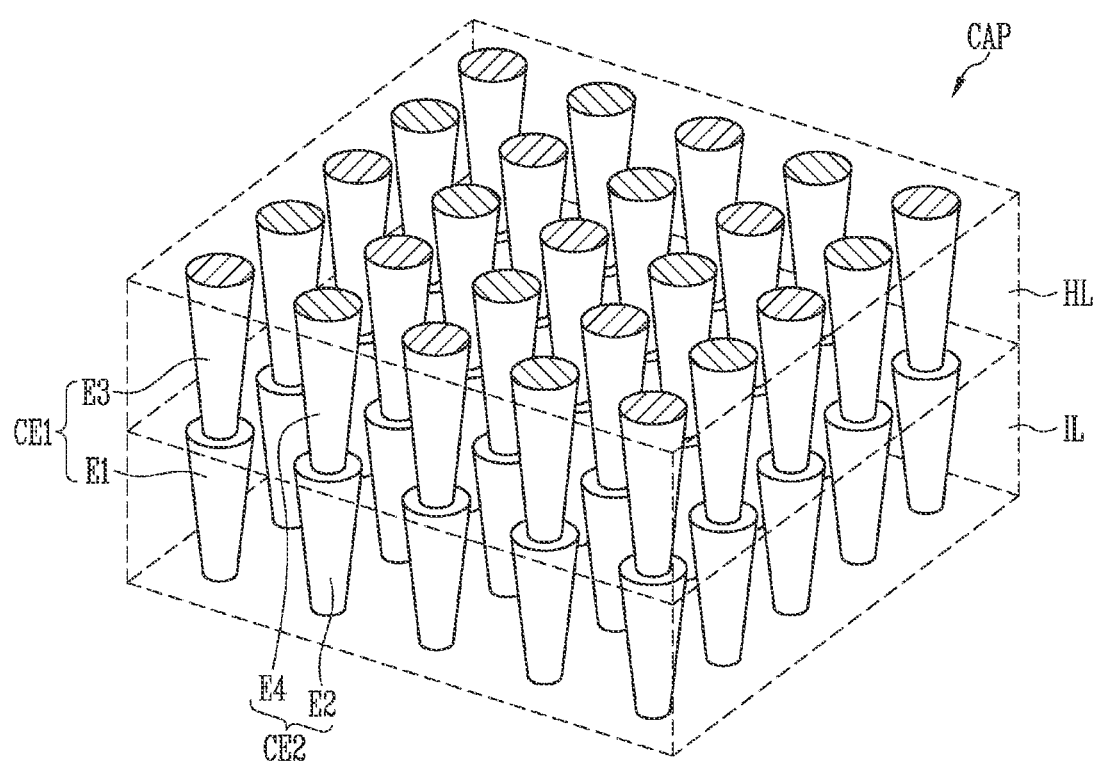

FIGS. 2A to 2C are views illustrating a structure of a semiconductor device in accordance with an embodiment of the present disclosure. FIG. 2B may be a layout of FIG. 2A, and FIG. 2A may be a sectional view taken along line B-B' shown in FIG. 2B. Hereinafter, descriptions of portions overlapping with those described above will be omitted.

Referring to FIGS. 2A to 2C, the semiconductor device may include an insulating layer IL, first electrodes E1, second electrodes E2, a high dielectric constant layer HL, third electrodes E3, and fourth electrodes E4. The semiconductor device may further include a capping layer C, first lines L1, or second lines L2, or further include a combination thereof.

The insulating layer IL may include oxide such as silicon oxide. In an embodiment, the insulating layer IL may include a High Density Plasma (HDP) oxide layer or a Tetra-Ethyl-Ortho-Silicate (TEOS) oxide layer, or include a combination thereof.

The high dielectric constant layer HL may be located on the top of the insulating layer IL or be located on the bottom of the insulating layer IL. The high dielectric constant layer HL may include a material having a dielectric constant higher than that of the insulating layer IL. The high dielectric constant layer HL may include a high dielectric constant (high-k) material such as hafnium oxide ($HfO_x$). The capping layer may be interposed between the insulating layer IL and the high dielectric constant layer HL. In an embodiment, the capping layer C may be interposed between the insulating layer IL and the high dielectric constant layer HL regardless of whether the insulating layer IL is located over or under the high dielectric constant layer HL.

The first electrodes E1 and the second electrodes E2 may penetrate the insulating layer IL. The first electrodes E1 and the second electrodes E2 may be arranged in a first direction I and a second direction II intersecting the first direction I. The first electrodes E1 and the second electrodes E2 may be alternately arranged in the first direction I and the second direction II.

The third electrodes E3 may penetrate the high dielectric constant layer HL or penetrate the high dielectric constant layer HL and the capping layer C. The third electrode E3 may be respectively connected to the first electrodes E1. The fourth electrodes E4 may be located between the third electrodes E3. The fourth electrodes E4 may penetrate the high dielectric constant layer HL or penetrate the high dielectric constant layer HL and the capping layer C. The fourth electrodes E4 may be respectively connected to the second electrodes E2.

The third electrodes E3 and the fourth electrodes E4 may be arranged in the first direction I and the second direction II. The third electrodes E3 and the fourth electrodes E4 may be alternately arranged along the first direction I and the second direction II.

Each of the first lines L1 may extend in a third direction III, and electrically connect third electrodes E3 arranged in the third direction III. Each of the second lines L2 may extend in the third direction III, and electrically connect fourth electrodes E4 arranged in the third direction III. The first lines L1 and the second lines L2 may be alternately arranged.

According to the structure described above, a first capacitor electrode CE1, a second capacitor electrode CE2, the insulating layer IL, and the high dielectric constant layer HL may constitute one capacitor CAP. In an embodiment, as shown in FIGS. 2A to 2C, one or more first capacitor electrodes CE1, and one or more second capacitor electrodes CE2, the high dielectric constant layer HL, and the insulating layer IL may constitute one capacitor CAP. The first capacitor electrode CE1 may include one of the first electrodes E1 and one of the third electrodes E3, which are electrically connected to each other. The second capacitor electrode CE2 may include one of the second electrodes E2 and one of the fourth electrodes E4, which are electrically connected to each other. For example, as shown in FIG. 2A, the first capacitor electrode CE1 includes the first electrode E1 and the third electrode E3, which are electrically connected to each other. For example, as shown in FIG. 2A, the second capacitor electrode includes the second electrode E2 and the fourth electrode E4, which are electrically connected to each other.

Since the capacitor CAP includes the insulating layer IL and the high dielectric constant layer HL, the capacitance of the capacitor CAP can be increased as compared with a capacitor including no high dielectric constant layer. Also, since the insulating layer IL and the high dielectric constant layer are combined, the capacitance of the capacitor CAP can be adjusted.

Figure 3A:
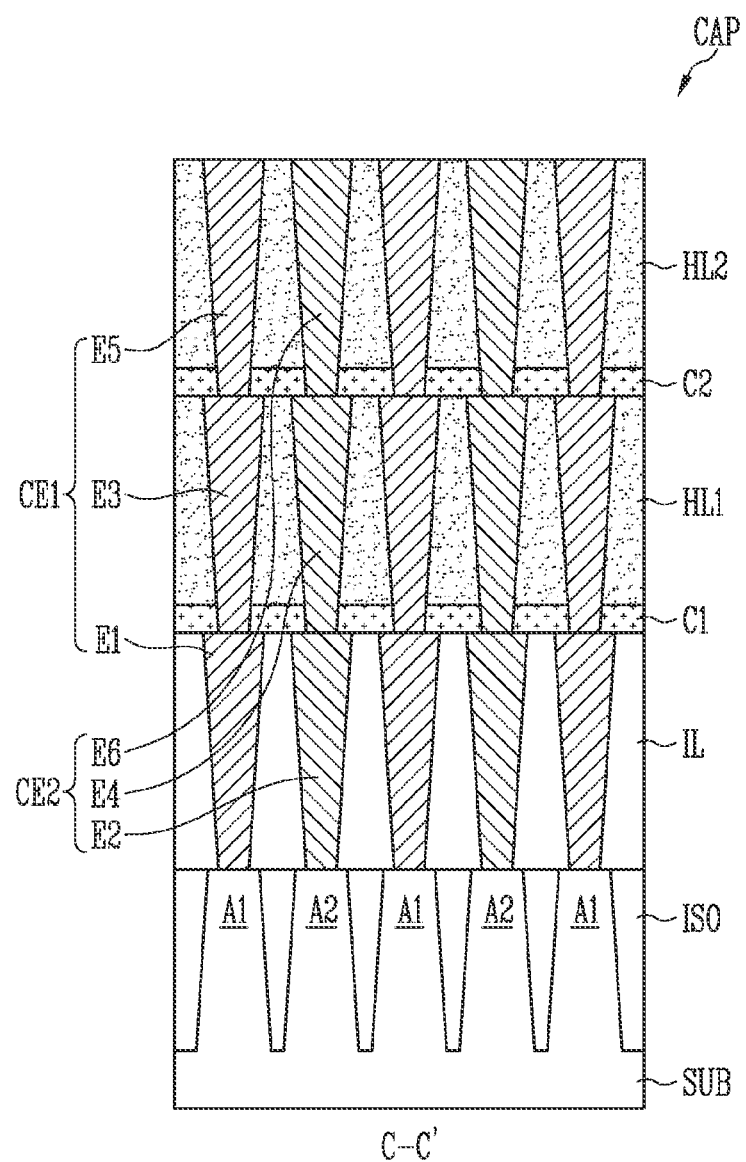
FIGS. 3A and 3B are views illustrating a structure of a semiconductor device in accordance with an embodiment of the present disclosure.
Figure 3B:
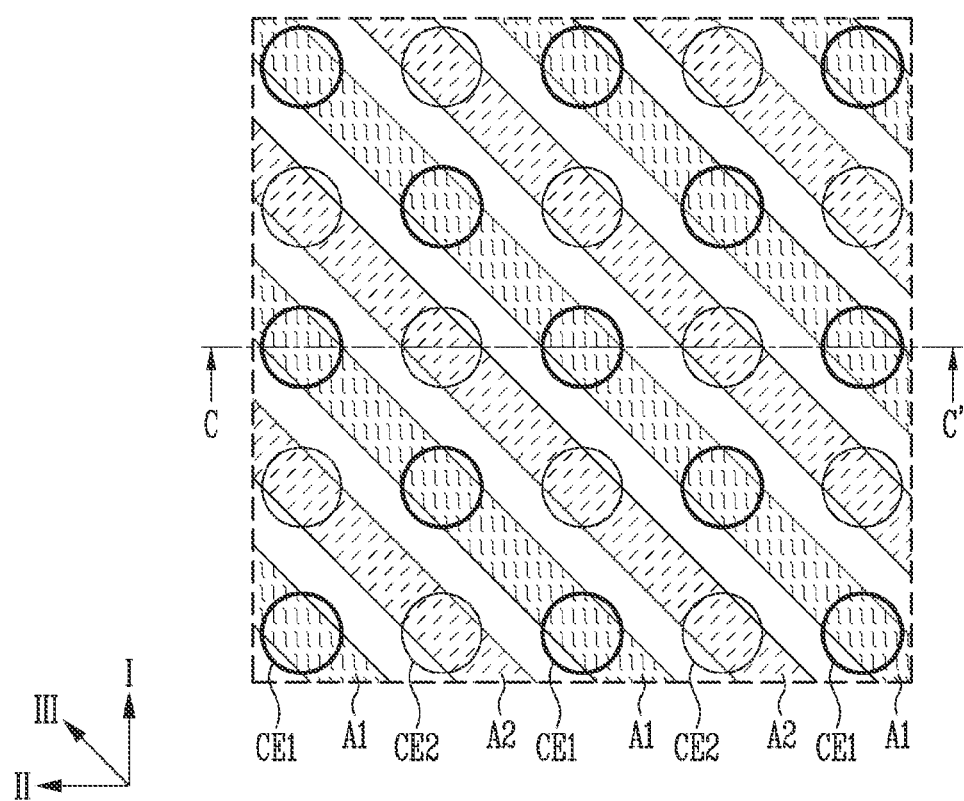

FIGS. 3A and 3B are views illustrating a structure of a semiconductor device in accordance with an embodiment of the present disclosure. FIG. 3A may be a sectional view taken along line C-C' shown in FIG. 3B. Hereinafter, descriptions of portions overlapping with those described above will be omitted.

Referring to FIGS. 3A and 3B, the semiconductor device may include an insulating layer IL, first electrodes E1, second electrodes E2, a first high dielectric constant layer HL1, third electrodes E3, and fourth electrodes E4. The semiconductor device may further include a substrate SUB, a first capping layer C1, a second capping layer C2, a second high dielectric constant layer HL2, fifth electrodes E5, or sixth electrodes E6, or further include a combination thereof.

The second high dielectric constant layer HL2 may be located on the top of the first high dielectric constant layer HL1. The second high dielectric constant layer HL2 may include a material having a dielectric constant higher than that of the insulating layer IL. The second high dielectric constant layer HL2 may include a high dielectric constant (high-k) material such as hafnium oxide ($HfO_x$). The second high dielectric constant layer HL2 may include the same high dielectric constant material as the first high dielectric constant layer HL1, or include a high dielectric constant material different from that of the first high dielectric constant layer HL1.

The second capping layer C2 may be interposed between the first high dielectric constant layer HL1 and the second high dielectric constant layer HL2. The second capping layer C2 may be used to prevent or mitigate migration of a metal included in the third electrodes E3 or the fourth electrodes E4. Also, the second capping layer C2 may be used as an etch stop layer in a manufacturing process of the semiconductor device. The second capping layer C2 may include the same material as the first capping layer C1, or include a material different from that of the first capping layer C1. In an embodiment, the second capping layer C2 may include nitride.

The fifth electrodes E5 may be located corresponding to the third electrodes E3. The fifth electrodes E5 may penetrate the second high dielectric constant layer HL2, and be respectively connected to the third electrodes E3. When the second capping layer C2 is located between the first high dielectric constant layer HL1 and the second high dielectric constant layer HL2, the fifth electrodes E5 may penetrate the second capping layer C2.

The sixth electrodes E6 may be located between the fifth electrodes E5. The sixth electrodes E6 may be located corresponding to the fourth electrodes E4. The sixth electrodes E6 may penetrate the second high dielectric constant layer HL2, and be respectively connected to the fourth electrodes E4. When the second capping layer C2 is located between the first high dielectric constant layer HL1 and the second high dielectric constant layer HL2, the sixth electrodes E6 may penetrate the second capping layer C2.

The fifth electrodes E5 and the sixth electrodes E6 may be arranged in a first direction I and a second direction II. In the first direction I, the fifth electrodes E5 and the sixth electrodes E6 may be alternately arranged. In the second direction II, the fifth electrodes E5 and the sixth electrodes E6 may be alternately arranged.

The substrate SUB may include first active regions A1 and second active regions A2. The substrate SUB may further include an isolation layer ISO. The first active regions A1 and the second active regions A2 may be defined in the substrate SUB by the isolation layer ISO.

The first active regions A1 may be connected to the first electrodes E1, and include a first-type impurity. The first-type impurity may include an N-type impurity such as phosphorus (P), arsenic (As) or antimony (Sb). The second active regions A2 may be connected to the second electrodes E2, and include a second-type impurity. The second-type impurity may include a P-type impurity such as boron (B), aluminum (Al), gallium (Ga) or indium (In).

Each of the first active regions A1 may extend in a third direction III, and electrically connect first electrodes E1 arranged in the third direction III. Each of the second active regions A2 may extend in the third direction III, and electrically connect second electrodes E2 arranged in the third direction III. The first active regions A1 and the second active regions A2 may be alternately arranged.

According to the structure described above, a first capacitor electrode CE1, a second capacitor electrode CE2, the insulating layer IL, the first high dielectric constant layer HL1, the second high dielectric constant layer HL2, one of the first active regions A1, and one of the second active regions A2 may constitute one capacitor CAP. In an embodiment, as shown in FIGS. 3A and 3B, one or more first capacitor electrodes CE1, and one or more second capacitor electrodes CE2, the insulating layer IL, the first high dielectric constant layer HL1, the second high dielectric constant layer HL2, one or more first active regions A1, and one or more second active regions A2 may constitute one capacitor CAP. The first capacitor electrode CE1 may include one of the first electrodes E1, one of the third electrodes E3, and one of the fifth electrodes E5, which are electrically connected to each other. The second capacitor electrode CE2 may include one of the second electrodes E2, one of the fourth electrodes E4, and one of the sixth electrodes E6, which are electrically connected to each other. For example, as shown in FIG. 3A, the first capacitor electrode CE1 includes the first electrode E1, the third electrode E3, and the fifth electrode E5, which are electrically connected to each other. For example, as shown in FIG. 3A, the second capacitor electrode includes the second electrode E2, the fourth electrode E4, and the sixth electrode E6, which are electrically connected to each other.

Since the capacitor CAP includes the insulating layer IL, the first high dielectric constant layer HL1, and the second high dielectric constant layer HL2, the capacitance of the capacitor CAP can be increased as compared with a capacitor including no high dielectric constant layer. In addition, the first electrodes E1 can be electrically connected to each other by using the first active regions A1, and the second electrodes E2 can be electrically connected to each other by using the second active regions A2.

Figure 4A:
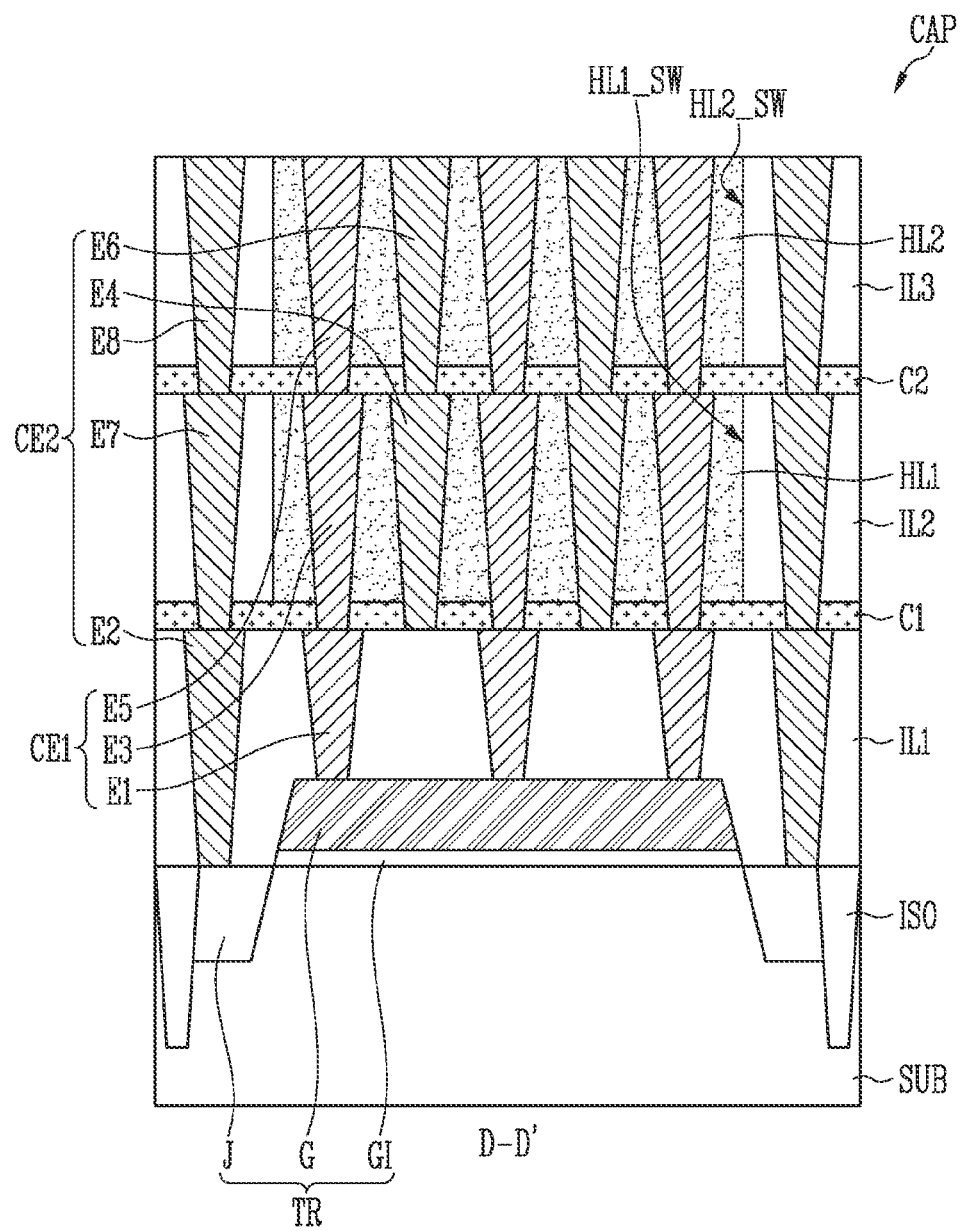
FIGS. 4A, 4B, and 4C are views illustrating a structure of a semiconductor device in accordance with an embodiment of the present disclosure.
Figure 4B:
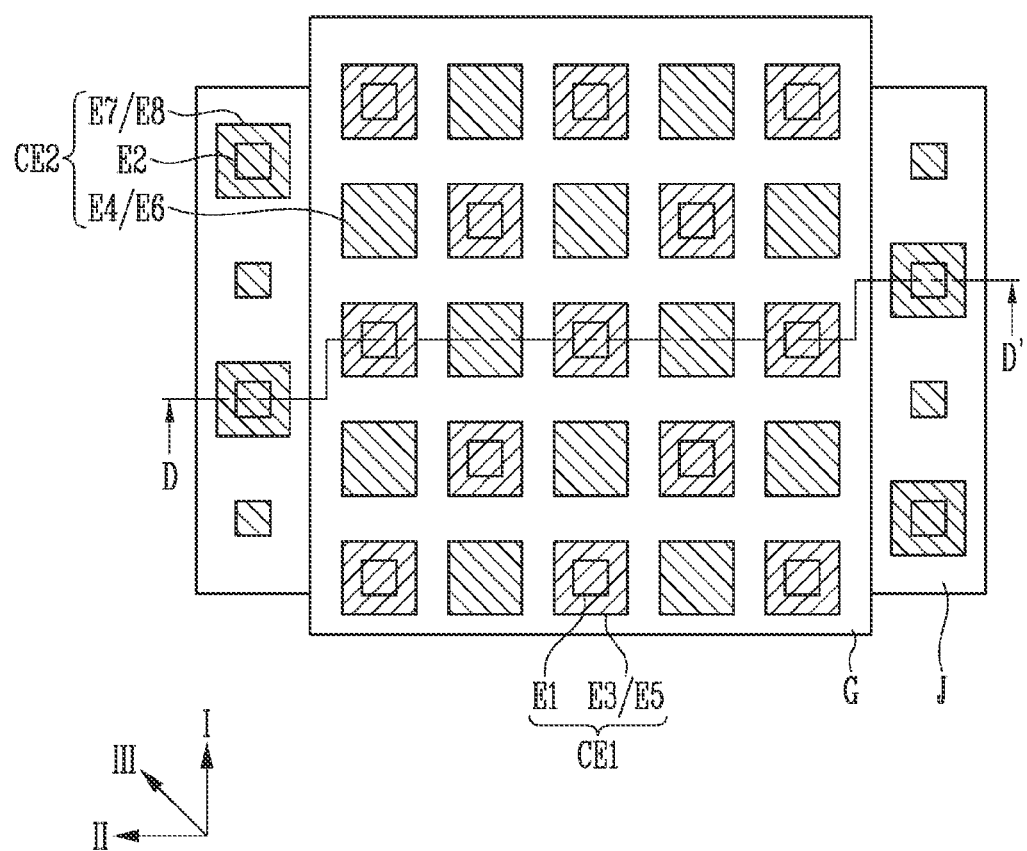
Figure 4C:
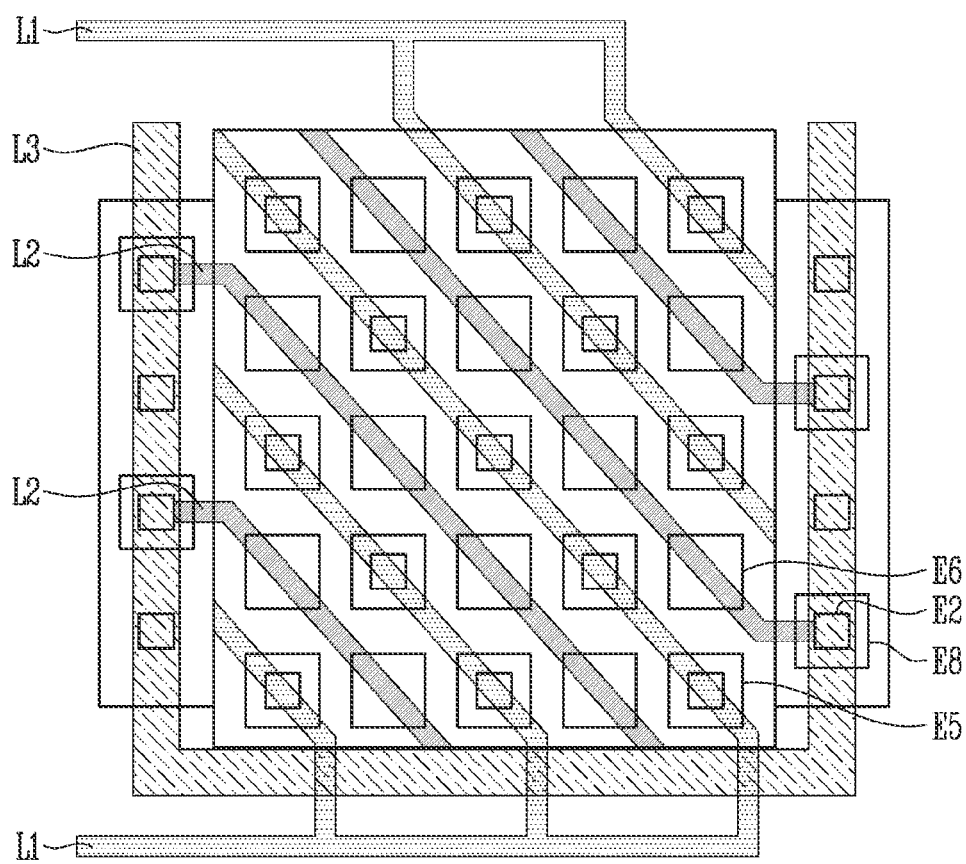

FIGS. 4A to 4C are views illustrating a structure of a semiconductor device in accordance with an embodiment of the present disclosure. FIG. 4A may be a sectional view taken along line D-D' shown in FIG. 4B. Hereinafter, descriptions of portions overlapping with those described above will be omitted.

Referring to FIGS. 4A to 4C, the semiconductor device may include a first insulating layer IL1, first electrodes E1, second electrodes E2, a first high dielectric constant layer HL1, third electrodes E3, and fourth electrodes E4. The semiconductor device may further include a substrate SUB, a transistor TR, a first capping layer C1, a second capping layer C2, a second high dielectric constant layer HL2, fifth electrodes E5, sixth electrodes E6, seventh electrodes E7, or eighth electrodes E8, or further include a combination thereof.

The transistor TR may be located on the substrate SUB. The transistor TR may include a gate electrode G, a gate insulating layer GI, and a junction J. The gate electrode G may be located on the substrate SUB. The gate insulating layer GI may be located between the substrate SUB and the gate electrode G. The junction J may be located in the substrate SUB at both sides of the gate electrode G. The junction J may be a region doped with an N-type or P-type impurity.

The first electrodes E1 may penetrate the first insulating layer IL1, and be electrically connected to the gate electrode G. The first electrodes E1 may be located corresponding to the third electrodes E3. The second electrodes E2 may penetrate the first insulating layer IL1, and be electrically connected to the junction J. The second electrodes E2 may be located at both the sides of the gate electrode G. The second electrodes E2 may be electrically connected to each other by a third line L3. The third line L3 may be located in the first insulating layer IL1.

The third electrodes E3 may penetrate the first high dielectric constant layer HL1 and the first capping layer C1, and be respectively connected to the first electrodes E1. The fourth electrodes E4 may penetrate the first high dielectric constant layer HL1 and the first capping layer C1. The fourth electrodes E4 may be located above the gate electrode G, and be spaced apart from the second electrodes E2.

A second insulating layer IL2 may surround a sidewall HL1_SW of the first high dielectric constant layer HL1. In an embodiment, the first high dielectric constant layer HL1 may be formed by depositing a high dielectric constant material in an opening formed by etching the second insulating layer IL2. The seventh electrodes E7 may penetrate the second insulating layer IL2 and the first capping layer C1, and be respectively connected to the second electrodes E2. A number of the seventh electrodes E7 may be equal to or different from that of the second electrodes E2. In an embodiment, the number of the seventh electrodes E7 may be smaller than that of the second electrodes E2, and only some of the second electrodes E2 may be connected to the seventh electrodes E7.

The fifth electrodes E5 may penetrate the second high dielectric constant layer HL2 and the second capping layer C2, and be respectively connected to the third electrodes E3. The sixth electrodes E6 may be located between the fifth electrodes E5. The sixth electrodes E6 may penetrate the second high dielectric constant layer HL2 and the second capping layer C2, and be respectively connected to the fourth electrodes E4.

A third insulating layer IL3 may surround a sidewall HL2_SW of the second high dielectric constant layer HL2. In an embodiment, the second high dielectric constant layer HL2 may be formed by depositing a high dielectric constant material in an opening formed by etching the third insulating layer IL3. The eighth electrodes E8 may penetrate the third insulating layer IL3 and the second capping layer C2, and be respectively connected to the seventh electrodes E7.

Each of first lines L1 may extend in a third direction III, and electrically connect fifth electrodes E5 arranged in the third direction III. Accordingly, the gate electrode G, the first electrodes E1, the third electrodes E3, and the fifth electrodes E5 are electrically connected to each other, thereby constituting a first capacitor electrode CE1.

Each of second lines L2 may extend in the third direction III, and electrically connect the sixth electrodes E6 arranged in the third direction III to the eighth electrodes E8. Accordingly, the junction J, the second electrodes E2, the seventh electrodes E7, the eighth electrodes E8, the fourth electrodes E4, and the sixth electrodes E6 are electrically connected to each other, thereby constituting a second capacitor electrode CE2.

According to the structure described above, the first capacitor electrode CE1, the second capacitor electrode CE2, the first insulating layer IL1, the first high dielectric constant layer HL1, the second high dielectric constant layer HL2, and the transistor TR may constitute one capacitor CAP.

Since the capacitor CAP includes the first insulating layer IL1, the first high dielectric constant layer HL1, and the second high dielectric constant layer HL2, the capacitance of the capacitor CAP can be increased as compared with a capacitor including no high dielectric constant layer. In addition, the first electrode E1 can be electrically connected to each other by using the gate electrode G, and the second electrodes E2 can be electrically connected to each other by using the junction J or the third line L3.

Figure 5A:
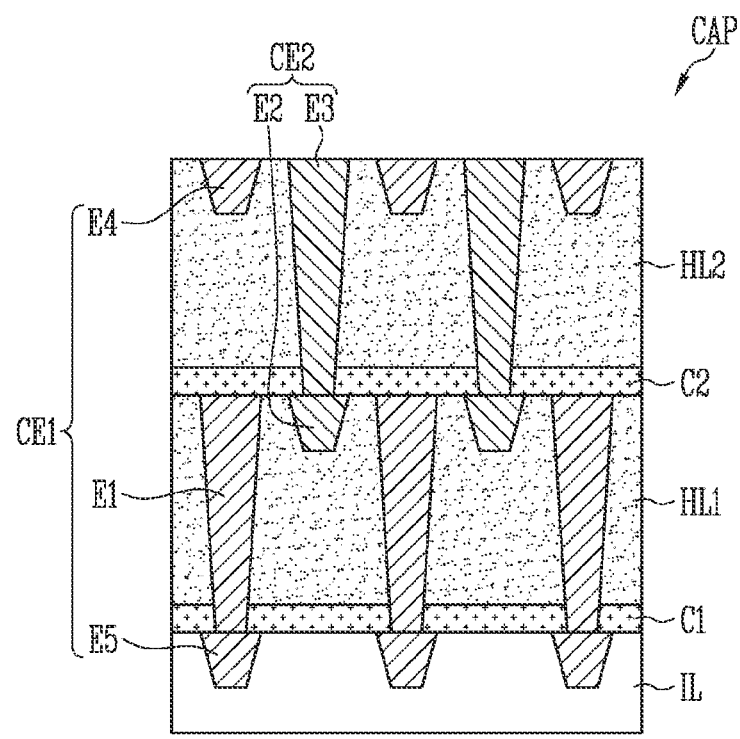
FIGS. 5A and 5B are views illustrating a structure of a semiconductor device in accordance with an embodiment of the present disclosure.
Figure 5B:
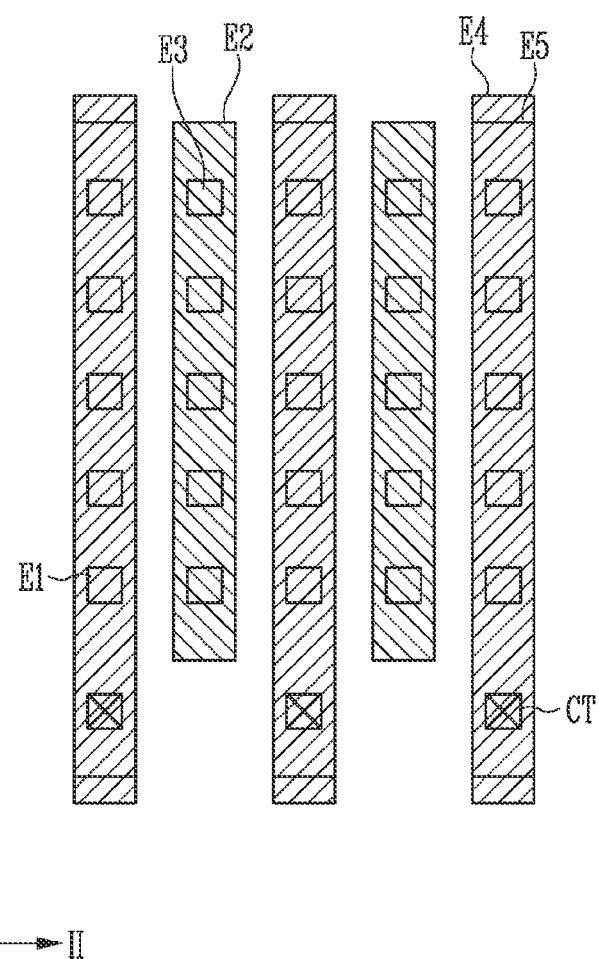

FIGS. 5A and 5B are views illustrating a structure of a semiconductor device in accordance with an embodiment of the present disclosure.

Referring to FIGS. 5A and 5B, the semiconductor device may include a first high dielectric constant layer HL1, first electrodes E1, second electrodes E2, a second high dielectric constant layer HL2, third electrodes E3, and the fourth electrodes E4. The semiconductor device may further include an insulating layer IL, a first capping layer C1, a second capping layer C2, fifth electrodes E5, or further include a combination thereof.

The first electrodes E1 may penetrate the first high dielectric constant layer HL1 or penetrate the first high dielectric constant layer HL1 and the first capping layer C1. The first electrodes E1 may be alternately arranged in a first direction I and a second direction II. The second electrodes E2 may penetrate the first high dielectric constant layer HL1 with a length different from that of the first electrodes E1. The second electrodes E2 may penetrate the first high dielectric constant layer HL1 to a partial depth. Each of the second electrodes E2 may extend in the first direction I.

The third electrodes E3 may penetrate the second high dielectric constant layer HL2 and the second capping layer C2. The third electrodes E3 may be alternately arranged in the first direction I and the second direction II. The third electrodes E3 may be connected to the second electrodes E2. Each of the second electrodes E2 may electrically connect third electrodes E3 arranged in the first direction I.

The fourth electrodes E4 may penetrate the second high dielectric constant layer HL2 to a depth different from that of the third electrodes E3. The fourth electrodes E4 may penetrate the second high dielectric constant layer HL2 to a partial depth, and be spaced apart from the first electrodes E1. Each of the fourth electrodes E4 may extend in the first direction I.

The insulating layer IL may be located on the bottom of the first high dielectric constant layer HL1. The fifth electrodes E5 may penetrate the insulating layer IL. In an embodiment, the fifth electrodes E5 may penetrate the insulating layer IL to a partial depth. The fifth electrodes E5 may extend in the first direction I. Each of the fifth electrodes E5 may electrically connect first electrodes E1 arranged in the first direction I. A fourth electrode E4 and a fifth electrode E5, which overlap with each other in a stacking direction, may be electrically connected to each other by a contact plug CT.

According to the structure described above, a first capacitor electrode CE1, a second capacitor electrode CE2, the insulating layer IL, the first high dielectric constant layer HL1, and the second high dielectric constant layer HL2 may constitute one capacitor CAP. The first capacitor electrode CE1 may include the first, fourth, and fifth electrodes E1, E4, and E5 electrically connected to each other. The second capacitor electrode CE2 may include the second and third electrodes E2 and E3 electrically connected to each other.

Since the capacitor CAP includes the insulating layer IL, the first high dielectric constant layer HL1, and the second high dielectric constant layer HL2, the capacitance of the capacitor CAP can be increased as compared with a capacitor including no high dielectric constant layer. In addition, plug-type and line-type electrodes are combined, so that the capacitance of the capacitor CAP can be adjusted. According to the use of the capacitor CAP, the capacitance can be increased by increasing the number of plug-type electrodes, or the capacitance can be decreased by increasing the number of line-type electrodes.

FIGS. 6A to 6G are views illustrating a manufacturing method of a semiconductor device in accordance with an embodiment of the present disclosure. Hereinafter, descriptions of portions overlapping with those described above will be omitted.

Figure 6A:
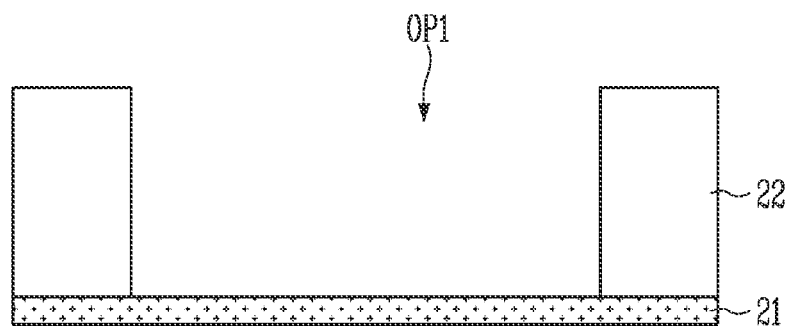
FIGS. 6A, 6B, 6C, 6D, 6E, 6F, and 6G are views illustrating a manufacturing method of a semiconductor device in accordance with an embodiment of the present disclosure.

Referring to FIG. 6A, a first capping layer 21 is formed. The first capping layer 21 may include nitride. Subsequently, a first insulating layer 22 is formed on the first capping layer 21. The first insulating layer 22 may include an insulating material such as silicon oxide. Subsequently, a first opening OP1 is formed by etching the first insulating layer 22. The first opening OP1 may have a depth at which the first capping layer 21 is exposed. When the first insulating layer 22 is etched, the first capping layer 21 may be used as an etch stop layer.

Figure 6B:
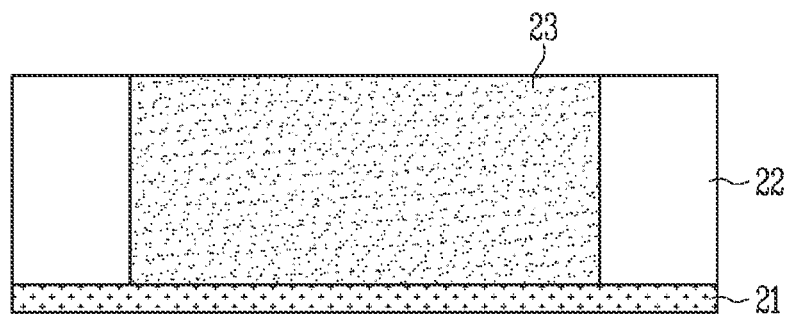

Referring to FIG. 6B, a first high dielectric constant layer 23 is formed in the first opening OP1. The first high dielectric constant layer 23 may include a high dielectric constant (high-k) material such as hafnium oxide ($HfO_x$). In an embodiment, the first high dielectric constant layer 23 may be formed by depositing a high dielectric constant material to fill the first opening OP1, and then planarizing the high dielectric constant material until a surface of the first insulating layer 22 is exposed. The planarizing process may use a Chemical Mechanical Polishing (CMP) process.

Figure 6C:
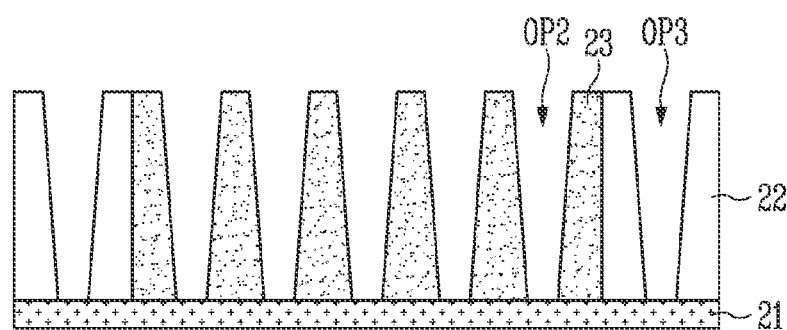

Referring to FIG. 6C, second openings OP2 are formed, which penetrate the first high dielectric constant layer 23. The second openings OP2 may be arranged in a first direction and a second direction intersecting the first direction. Each of the second openings OP2 may have a plane with a circular shape, an elliptical shape, a polygonal shape, or the like. The second openings OP2 may be formed by using a photolithography process. Since the second openings OP2 are formed to have a hole type, width balance, etc. can be improved in an exposure process, as compared with when line-type openings are formed. The second openings OP2 may have a depth at which the first capping layer 21 is exposed. When the first high dielectric constant layer 23 is etched, the first capping layer 21 may be used as an etch stop layer.

When the second openings OP2 are formed, third openings OP3 may be formed, which penetrate the first insulating layer 22. The third openings OP3 may have a depth at which the first capping layer 21 is exposed.

Figure 6D:
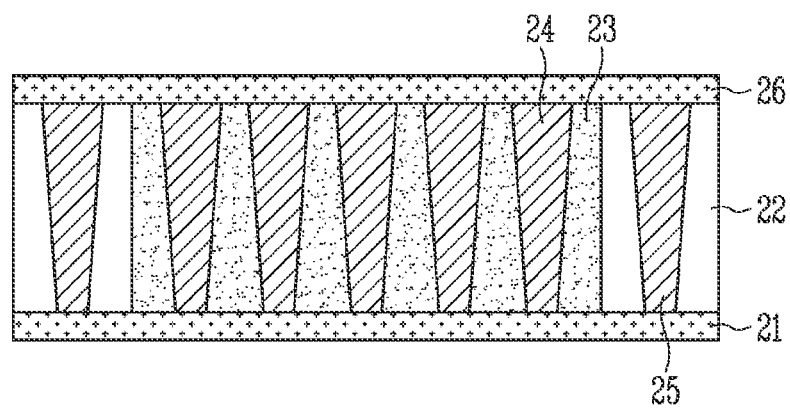

Referring to FIG. 6D, first conductive layers 24 are respectively formed in the second openings OP2. When the first conductive layers 24 are formed, second conductive layers 25 may be respectively formed in the third openings OP3. In an embodiment, after a conductive material is deposited to fill the second openings OP2 and the third openings OP3, the conductive material is planarized until surfaces of the first high dielectric constant layer 23 and the first insulating layer 22 are exposed. The conductive material may include a metal such as tungsten (W), copper (Cu) or molybdenum (Mo).

Subsequently, a second capping layer 26 is formed. The second capping layer 26 may include the same material as the first capping layer 21 or include a material different from that of the first capping layer 21. In an embodiment, the second capping layer 26 may include nitride.

Figure 6E:
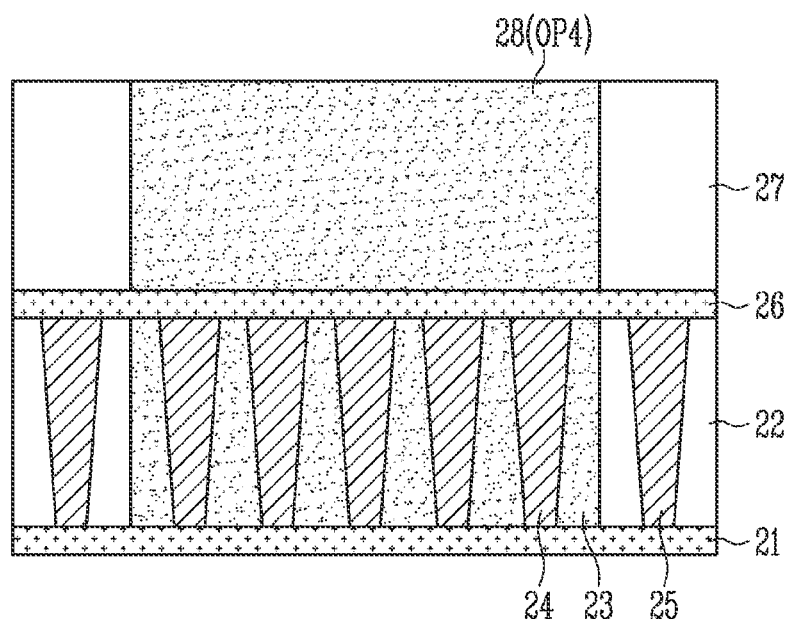

Referring to FIG. 6E, a second insulating layer 27 is formed on the second capping layer 26. Subsequently, a fourth opening OP4 is formed by etching the second insulating layer 27. The fourth opening OP4 may have a depth at which the second capping layer 26 is exposed. When the second insulating layer 27 is etched, the second capping layer 26 may be used as an etch stop layer. Subsequently, a second high dielectric constant layer 28 is formed in the fourth opening OP4. The second high dielectric constant layer 28 may include a high dielectric constant (high-k) material such as hafnium oxide (HfOx).

Figure 6F:
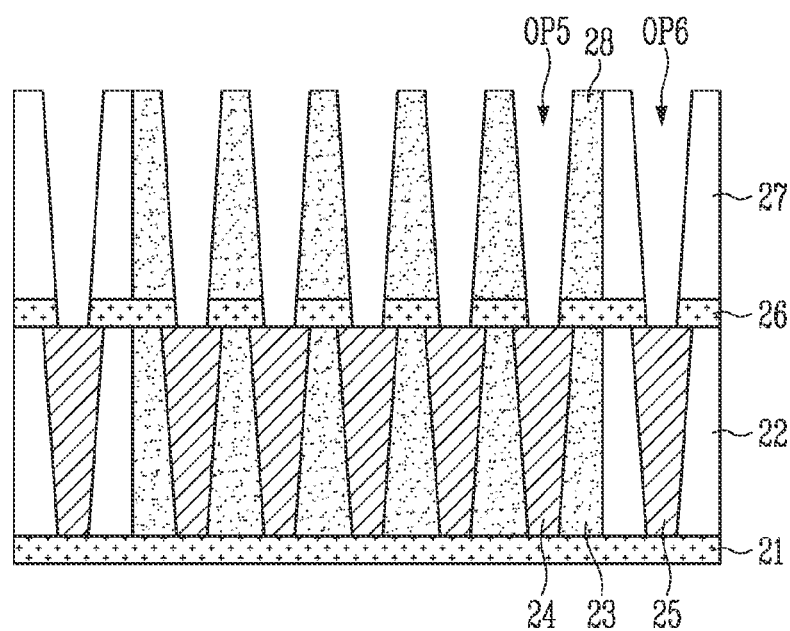

Referring to FIG. 6F, fifth openings OP5 are formed, which penetrate the second high dielectric constant layer 28. The fifth openings OP5 may be arranged in the first direction and the second direction intersecting the first direction. Each of the fifth openings OP5 may have a plane with a circular shape, an elliptical shape, a polygonal shape, or the like. The fifth openings OP5 may be formed by using a photolithography process. Since the fifth openings OP5 are formed to have a hole type, width balance, etc. can be improved in an exposure process, as compared with when line-type openings are formed.

The fifth openings OP5 may have a depth at which the first conductive layers 24 are exposed, while penetrating the second capping layer 26. When the fifth openings OP5 are formed, sixth openings OP6 may be formed, which penetrate the second insulating layer 27. The sixth openings OP6 may have a depth at which the second conductive layers 25 are exposed.

Figure 6G:
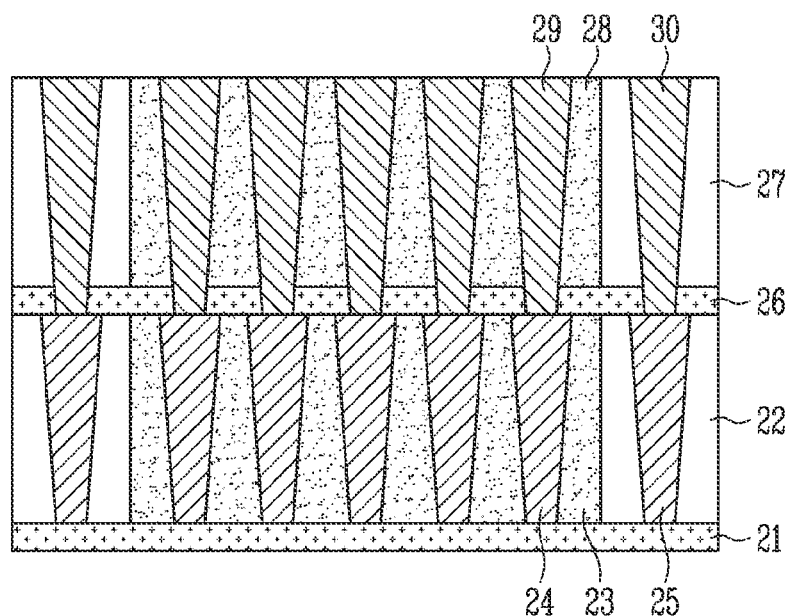

Referring to FIG. 6G, third conductive layers 29 are respectively formed in the fifth openings OP5. The third conductive layers 29 may be respectively connected to the first conductive layers 24. When the third conductive layers 29 are formed, fourth conductive layers may be respectively formed in the sixth openings OP6. The fourth conductive layers 30 may be respectively connected to the second conductive layers 25.

The first conductive layers 24, the third conductive layers 29, the first high dielectric constant layer 23, and the second high dielectric constant layer 28 may constitute a capacitor. The second conductive layers 25 and the fourth conductive layers 30 may be a portion of the capacitor, or be a portion of an interconnection such as a contact plug.

According to the manufacturing method described above, the first conductive layers 24 and the third conductive layers 29, which are used as electrodes of the capacitor, can be formed by using the hole-type second and fifth openings OP2 and OP5. In addition, a dielectric of the capacitor can be formed by using the first high dielectric constant layer 23 and the second high dielectric constant layer 28. Thus, the manufacturing process of the semiconductor device can be improved, and the capacitance of the capacitor can be increased.

Figure 7A:
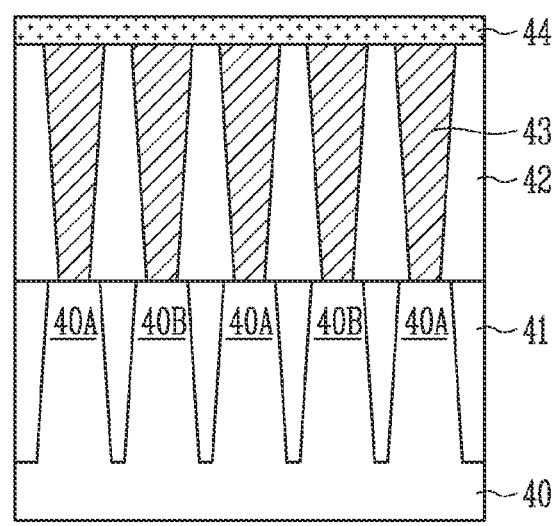
FIGS. 7A and 7B are views illustrating a manufacturing method of a semiconductor device in accordance with an embodiment of the present disclosure.
Figure 7B:
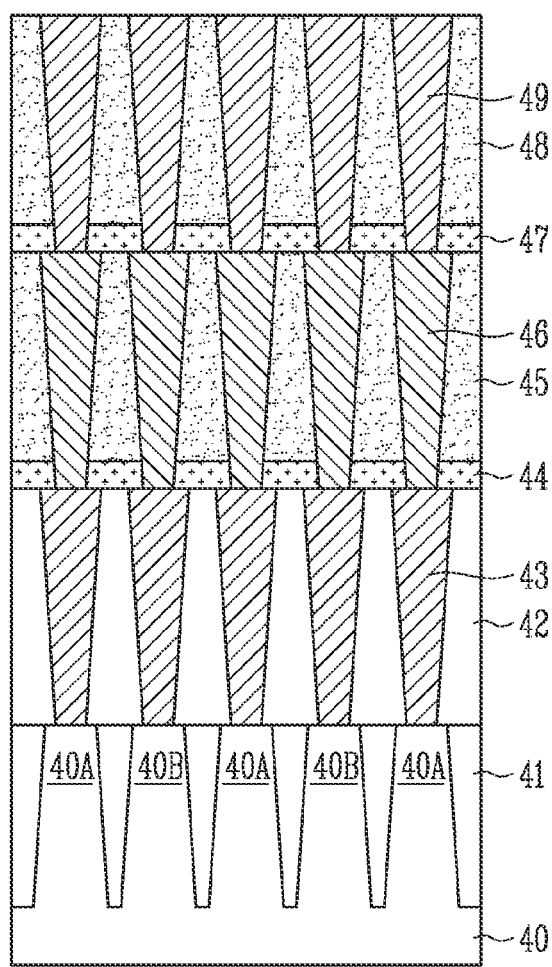

FIGS. 7A and 7B are views illustrating a manufacturing method of a semiconductor device in accordance with an embodiment of the present disclosure. Hereinafter, descriptions of portions overlapping with those described above will be omitted.

Referring to FIG. 7A, first active regions 40A and second active regions 40B are formed in a substrate 40. The first active regions 40A may include an N-type impurity, and the second active regions 40B may include a P-type impurity. In an embodiment, the first active regions 40A and the second active regions 40B may be defined by forming isolation layers 41 in the substrate 40.

Subsequently, an insulating layer 42 is formed. The insulating layer 42 may include oxide such as silicon oxide. Subsequently, first conductive layers 43 are formed, which penetrate the insulating layer 42. The first conductive layers 43 may be connected to the first active regions 40A or the second active regions 40B. Subsequently, a first capping layer 44 is formed. The first capping layer 44 may include nitride.

Referring to FIG. 7B, a first high dielectric constant layer 45 is formed. The first high dielectric constant layer 45 may include a high dielectric constant (high-k) material such as hafnium oxide ($HfO_x$). Subsequently, second conductive layers 46 are formed, which penetrate the first high dielectric constant layer 45 and the first capping layer 44. The second conductive layers 46 may be respectively connected to the first conductive layers 43.

Subsequently, a second capping layer 47 is formed on the first high dielectric constant layer 45 and the second conductive layers 46. The second capping layer 47 may include the same material as the first capping layer 44 or include a material different from that of the first capping layer 44. Subsequently, a second high dielectric constant layer 48 is formed on the second capping layer 47. The second high dielectric constant layer 48 may include the same high dielectric constant (high-k) material as the first high dielectric constant layer 45 or include a high dielectric constant (high-k) material different from that of the first high dielectric constant layer 45. Subsequently, third conductive layers 49 are formed, which penetrate the second high dielectric constant layer 48 and the second capping layer 47. The third conductive layers 49 may be respectively connected to the second conductive layers 46.

According to the manufacturing method described above, the first plug-type conductive layers 43, the second plug-type conductive layers 46, and the third plug-type conductive layers 49 can be formed, which are used as electrodes of a capacitor. A dielectric of the capacitor can be formed by using the first high dielectric constant layer 45 and the second high dielectric constant layer 48. In addition, the first conductive layers 43 can be electrically connected to each other by using the first active regions 40A and the second active regions 40B. Thus, the manufacturing process of the semiconductor device can be improved, and the capacitance of the capacitor can be increased.

Figure 8A:
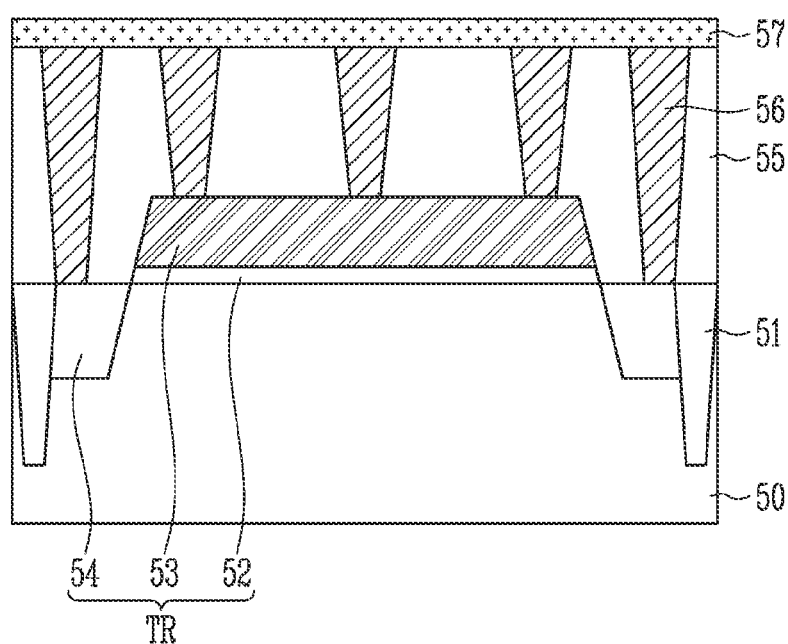
FIGS. 8A and 8B are views illustrating a manufacturing method of a semiconductor device in accordance with an embodiment of the present disclosure.
Figure 8B:
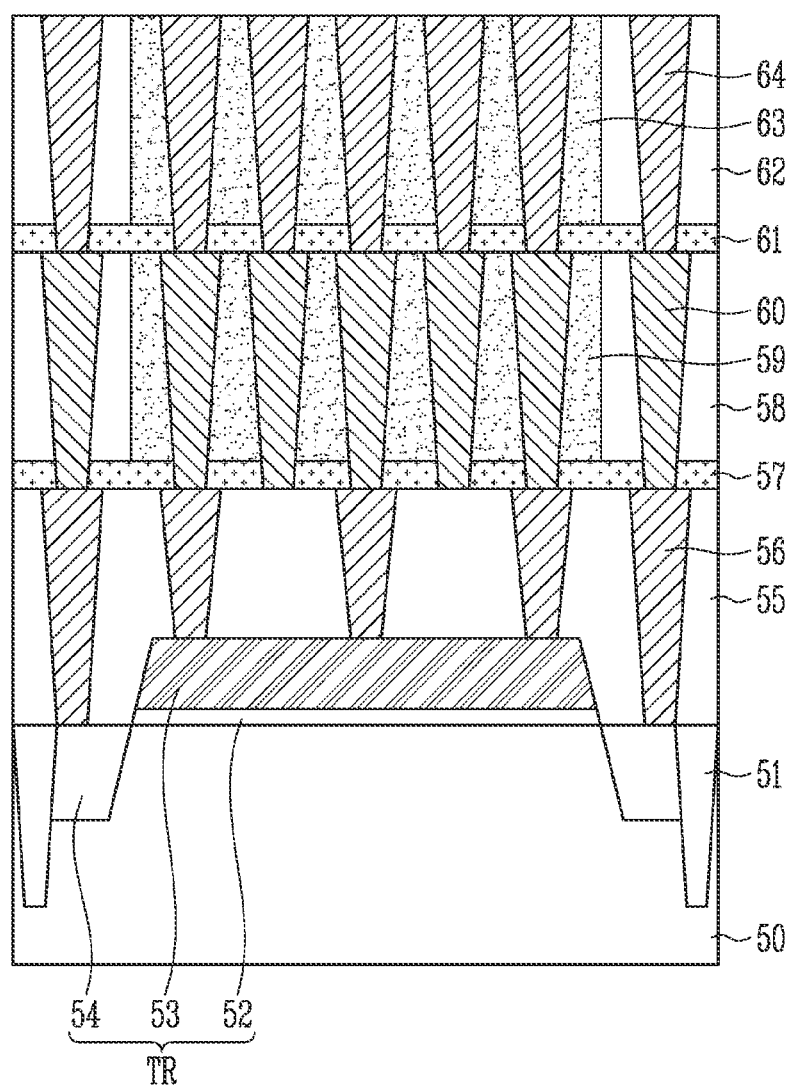

FIGS. 8A and 8B are views illustrating a manufacturing method of a semiconductor device in accordance with an embodiment of the present disclosure. Hereinafter, descriptions of portions overlapping with those described above will be omitted.

Referring to FIG. 8A, isolation layers 51 and a transistor TR are formed at the substrate 50. The transistors TR may include a gate electrode 53, a gate insulating layer 52, and a junction 54. Subsequently, after a first insulating layer 55 is formed, first conductive layers 56 are formed, which penetrate the first insulating layer 55. The first conductive layers 56 may be connected to the gate electrode 53 or the junction 54. Subsequently, a first capping layer 57 is formed.

Referring to FIG. 8B, a second insulating layer 58 is formed on the first capping layer 57. Subsequently, after an opening is formed by etching the second insulating layer 58, a first high dielectric constant layer 59 is formed in the opening. Subsequently, second conductive layers 60 are formed. The second conductive layers 60 may penetrate the second insulating layer 58 or the first high dielectric constant layer 59. The second conductive layers 60 may be respectively connected to the first conductive layers 56.

Subsequently, a second capping layer 61 is formed on the second insulating layer 58 and the first high dielectric constant layer 59. Subsequently, a third insulating layer 62 is formed on the second capping layer 61. Subsequently, after an opening is formed by etching the third insulating layer 62, a second high dielectric constant layer 63 is formed in the opening. Subsequently, third conductive layers 64 are formed. The third conductive layers 64 may penetrate the third insulating layer 62 or the second high dielectric constant layer 63. The third conductive layers 64 may be respectively connected to the second conductive layers 60.

According to the manufacturing method described above, the first plug-type conductive layers 56, the second plug-type conductive layers 60, and the third plug-type conductive layers 64 can be formed, which are used as electrodes of a capacitor. A dielectric of the capacitor can be formed by using the first insulating layer 55, the first high dielectric constant layer 59, and the second high dielectric constant layer 63. In addition, some of the first conductive layers 56 can be electrically connected to each other by using the gate electrode 53. Thus, the manufacturing process of the semiconductor device can be improved, and the capacitance of the capacitor can be increased.

FIGS. 9A to 9D are views illustrating a manufacturing method of a semiconductor device in accordance with an embodiment of the present disclosure. Hereinafter, descriptions of portions overlapping with those described above will be omitted.

Figure 9A:
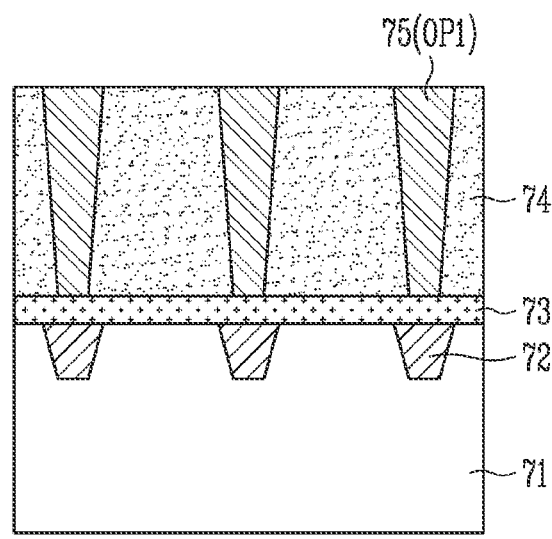
FIGS. 9A, 9B, 9C, and 9D are views illustrating a manufacturing method of a semiconductor device in accordance with an embodiment of the present disclosure.

Referring to FIG. 9A, first conductive layers 72 are formed in a first insulating layer 71. The first conductive layers 72 may be formed to penetrate the first insulating layer 71 to a partial depth. The first conductive layers 72 may have a line shape extending in a first direction. Subsequently, a first capping layer 73 is formed on the first insulating layer 71.

Subsequently, a first high dielectric constant layer 74 is formed on the first capping layer 73. Subsequently, first openings OP1 are formed, which penetrate first high dielectric constant layer 74. The first openings OP1 may be arranged in the first direction and a second direction intersecting the first direction. The first openings OP1 may expose the first capping layer 73. Subsequently, sacrificial layers 75 are respectively formed in the first openings OP1. In an embodiment, the sacrificial layers 75 may include a spin on carbon (SOC).

Figure 9B:
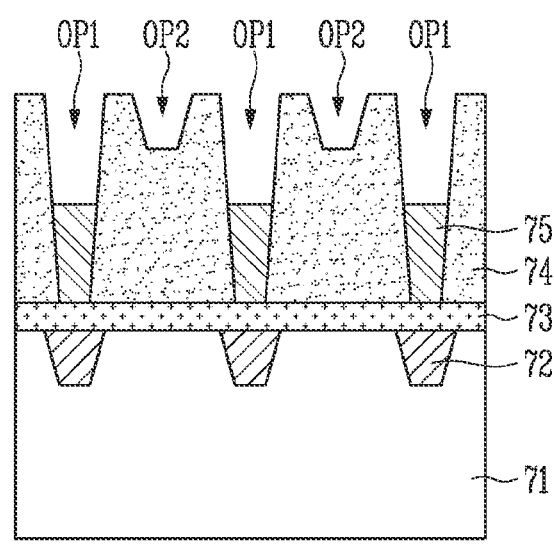

Referring to FIG. 9B, second openings OP2 are formed, which penetrate the first high dielectric constant layer 74. The second openings OP2 may penetrate the first high dielectric constant layer 74 to a partial depth. The second openings OP2 may extend in the first direction. When the second openings OP2 are formed, the sacrificial layers 75 may be partially etched, and accordingly, the first openings OP1 may be partially opened.

Figure 9C:
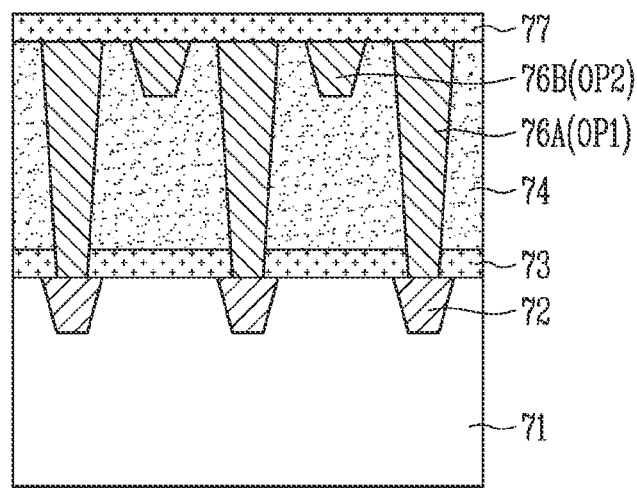

Referring to FIG. 9C, the sacrificial layers 75 are removed. Subsequently, the first openings OP1 are extended by etching the first capping layer 73 exposed through the first openings OP1. Accordingly, the first conductive layers 72 may be exposed. Subsequently, second conductive layers 76A are formed in the first openings OP1, and second conductive layers 76B are formed in the second openings OP2. Subsequently, a second capping layer 77 is formed on the first high dielectric constant layer 74.

Figure 9D:
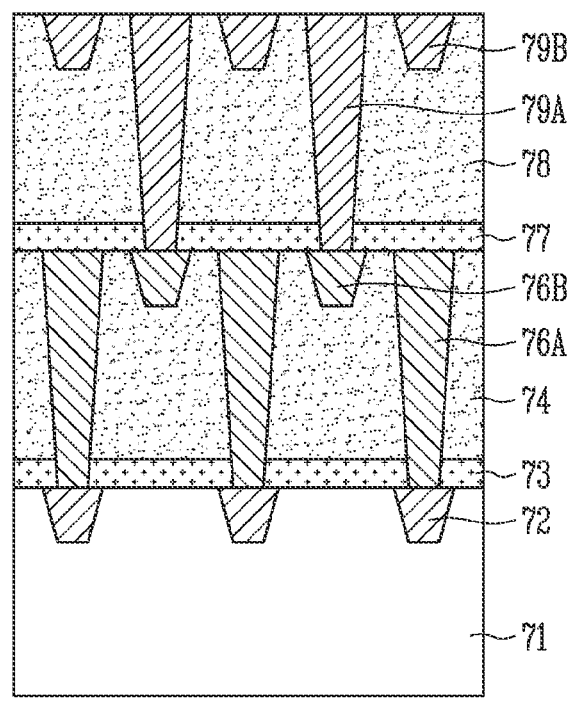

Referring to FIG. 9D, a second high dielectric constant layer 78 is formed on the second capping layer 77. Subsequently, third conductive layers 79A are formed, which penetrate the second high dielectric constant layer 78 and the second capping layer 77, and third conductive layers 79B are formed, which penetrate the second high dielectric constant layer 78 to a partial depth. The third conductive layers 79A and 79B may be formed through a process similar to that of forming the second conductive layers 76A and 76B.

According to the manufacturing method described above, the first conductive layers 72, the second conductive layers 76A and 76B, and the third conductive layers 79A and 79B, which are used as electrodes of a capacitor, can be formed by using a combination of plug and line types. A dielectric of the capacitor can be formed by using the first insulating layer 71, the first high dielectric constant layer 74, and the second high dielectric constant layer 78. Thus, the manufacturing process of the semiconductor device can be improved, and the capacitance of the capacitor can be increased.

Figure 10:
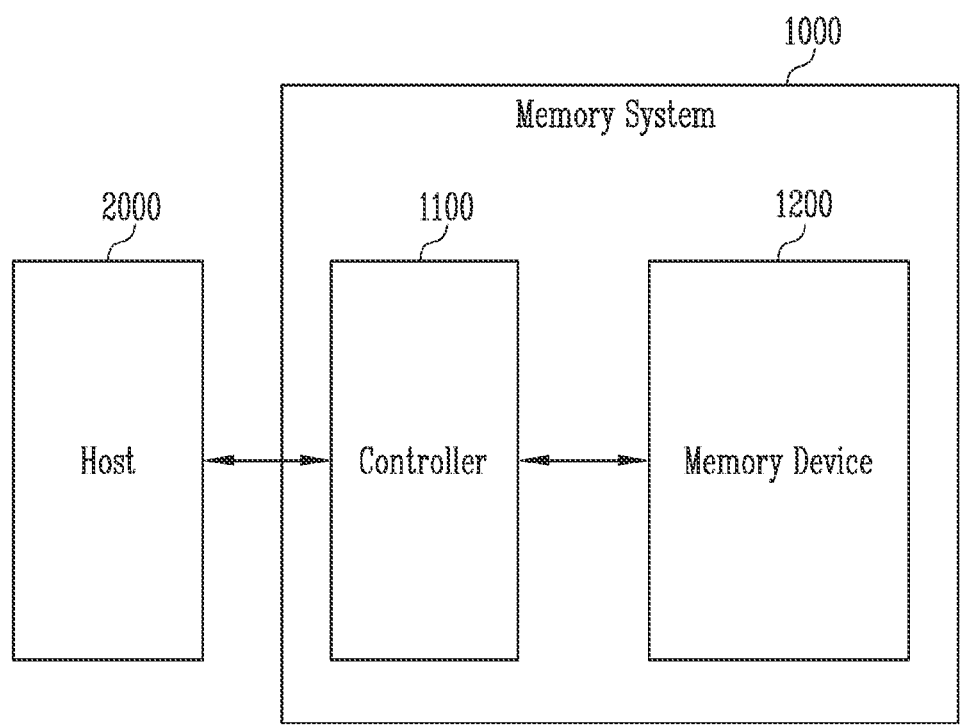
FIG. 10 is a diagram illustrating a memory system in accordance with an embodiment of the present disclosure.

FIG. 10 is a diagram illustrating a memory system in accordance with an embodiment of the present disclosure.

Referring to FIG. 10, the memory system 1000 may include a memory device 1200 configured to store data and a controller 1100 configured to communicate between the memory device 1200 and a host 2000.

The host 2000 may be a device or system which stores data in the memory system 1000 or retrieves data from the memory system 1000. The host 2000 may generate requests for various operations, and output the generated requests to the memory system 1000. The requests may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

The host 2000 may include at least one of a computer, a portable digital device, a tablet, a digital camera, a digital audio player, a television, a wireless communication device, and a cellular phone, but embodiments of the present disclosure are not limited thereto.

The controller 1100 may control overall operations of the memory system 1000. The controller 1100 may control the memory device 1200 according to a request of the host 2000. The controller 1100 may control the memory device 1200 to perform a program operation, a read operation, an erase operation, and the like according to a request of the host 2000. Alternatively, the controller 1100 may perform a background operation, etc. for improving the performance of the memory system 1000 without any request of the host 2000.

The controller 1100 may transmit a control signal and a data signal to the memory device 1200 so as to control an operation of the memory device 1200. The control signal and the data signal may be transmitted to the memory device 1200 through different input/output lines. The data signal may include a command, an address or data. The control signal may be used to distinguish a period in which the data signal is input.

The memory device 1200 may perform a program operation, a read operation, an erase operation, and the like under the control of the controller 1100. The memory device 1200 may be implemented with a volatile memory device in which stored data disappears when the supply of power is interrupted or a nonvolatile memory device in which stored data is retained even when the supply of power is interrupted. The memory device 1200 may be a semiconductor device having the structures described above with reference to FIGS. 1A to 5B. The memory device 1200 may be a semiconductor device manufactured by the manufacturing methods described above with reference to FIGS. 6A to 9D. In an embodiment, the semiconductor device may include: a first insulating layer; first electrodes penetrating the first insulating layer; second electrodes penetrating the first insulating layer, the second electrodes being located between the first electrodes; a first high dielectric constant layer including a material having a dielectric constant higher than that of the first insulating layer; third electrodes penetrating the first high dielectric constant layer, the third electrodes being respectively connected to the first electrodes; and fourth electrodes penetrating the first high dielectric constant layer, the fourth electrodes being located between the third electrodes.

Figure 11:
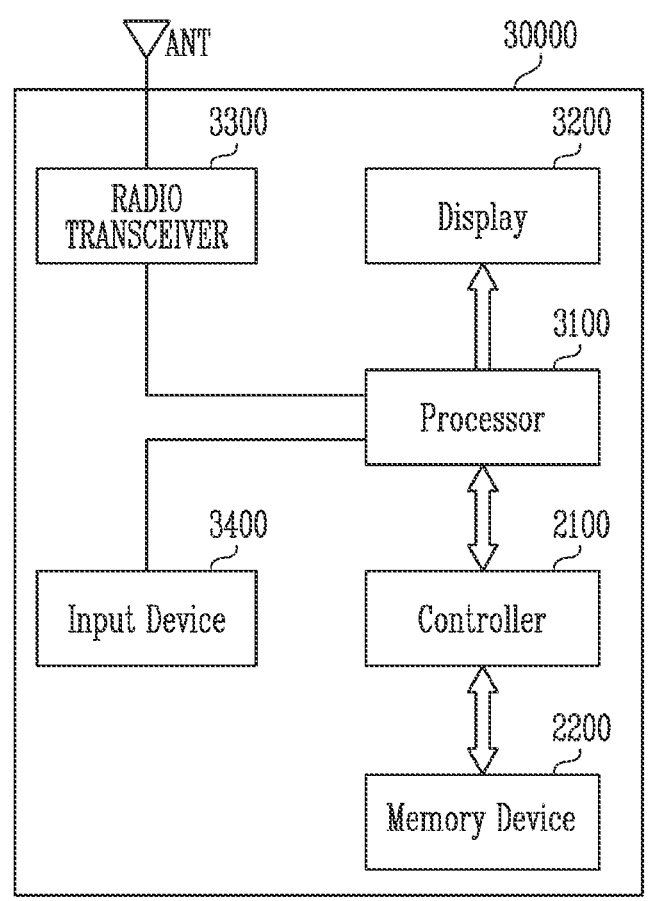
FIG. 11 is a diagram illustrating a memory system in accordance with an embodiment of the present disclosure.

FIG. 11 is a diagram illustrating a memory system in accordance with an embodiment of the present disclosure.

Referring to FIG. 11, the memory system 30000 may be implemented as a cellular phone, a smart phone, a tablet PC, a personal digital assistant (PDA), or a wireless communication device. The memory system 30000 may include a memory device 2200 and a controller 2100 capable of controlling an operation of the memory device 2200.

The controller 2100 may control a data access operation of the memory device 2200, e.g., a program operation, an erase operation, a read operation, or the like under the control of a processor 3100.

Data programmed in the memory device 2200 may be output through a display 3200 under the control of the controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 2100 or the display 3200. The controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 2100, data output from the radio transceiver 3300, or data output from the input device 3400 can be output through the display 3200.

In some embodiments, the controller 2100 capable of controlling an operation of the memory device 2200 may be implemented as a part of the processor 3100, or be implemented as a chip separate from the processor 3100.

Figure 12:
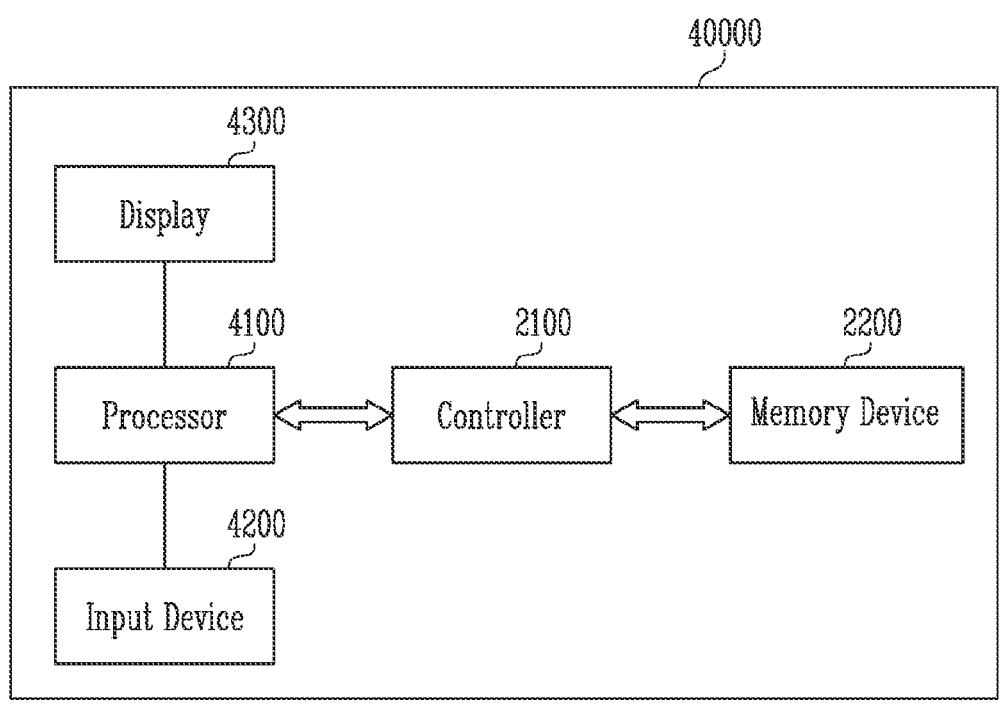
FIG. 12 is a diagram illustrating a memory system in accordance with an embodiment of the present disclosure.

FIG. 12 is a diagram illustrating a memory system in accordance with an embodiment of the present disclosure.

Referring to FIG. 12, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 2100. In some embodiments, the controller 2100 capable of controlling an operation of the memory device 2200 may be implemented as a part of the processor 4100, or be implemented as a chip separate from the processor 4100.

Figure 13:
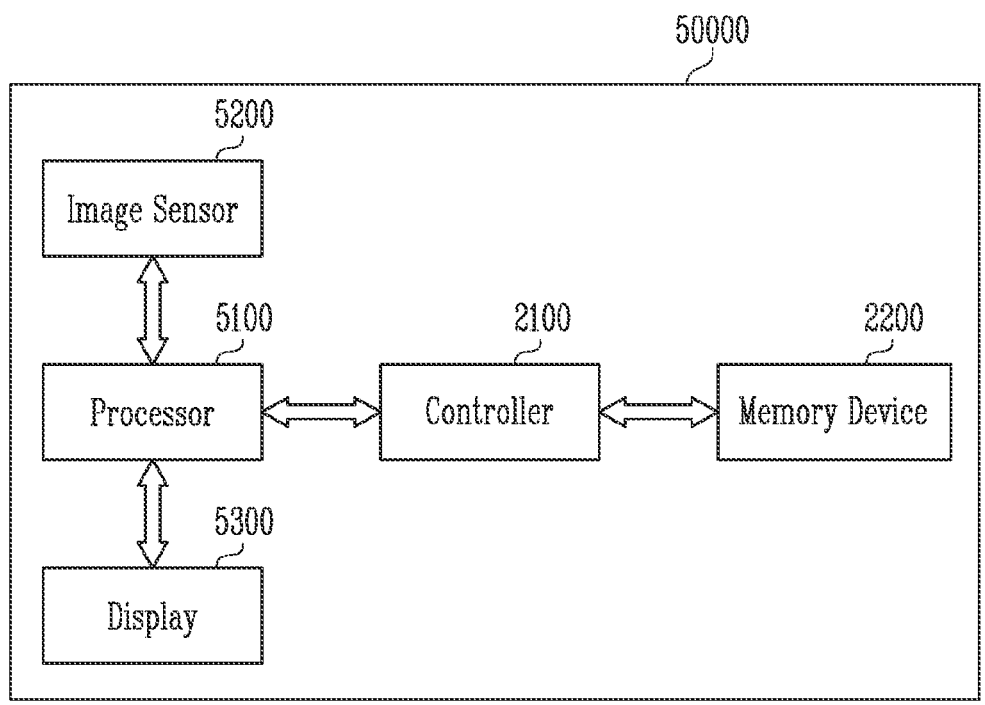
FIG. 13 is a diagram illustrating a memory system in accordance with an embodiment of the present disclosure.

FIG. 13 is a diagram illustrating a memory system in accordance with an embodiment of the present disclosure.

Referring to FIG. 13, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the controller 2100. Under the control of the processor 5100, the converted digital signals may be output through a display 5300, or be stored in the memory device 2200 through the controller 2100. In addition, data stored in the memory device 2200 may be output through the display 5300 under the control of the processor 5100 or the controller 2100.

In some embodiments, the controller 2100 capable of controlling an operation of the memory device 2200 may be implemented as a part of the processor 5100, or be implemented as a chip separate from the processor 5100.

Figure 14:
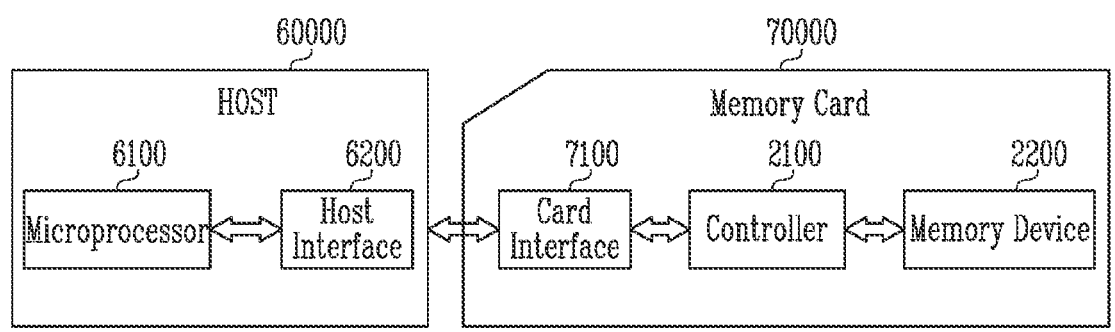
FIG. 14 is a diagram illustrating a memory system in accordance with an embodiment of the present disclosure.

FIG. 14 is a diagram illustrating a memory system in accordance with an embodiment of the present disclosure.

Referring to FIG. 14, the memory system 70000 may be implemented as a memory card or a smart card. The memory system 70000 may include a memory device 2200, a controller 2100, and a card interface 7100.

The controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the controller 2100 under the control of a microprocessor 6100.

In accordance with the present disclosure, memory cells are three-dimensionally stacked, so that the degree of integration of the semiconductor device can be improved. Further, the semiconductor device can have a stable structure and improved reliability.

The examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
   a first insulating layer;
   a plurality of first electrodes penetrating the first insulating layer;
   a plurality of second electrodes penetrating the first insulating layer, the plurality of second electrodes being located between the plurality of first electrodes:
   a first high dielectric constant layer having a dielectric constant higher than a dielectric constant of the first insulating layer;
   a plurality of third electrodes penetrating the first high dielectric constant layer, the plurality of third electrodes being respectively connected to the plurality of first electrodes; and
   a plurality of fourth electrodes penetrating the first high dielectric constant layer, the plurality of fourth electrodes being located between the plurality of third electrodes.

2. The semiconductor device of claim 1,
   wherein the plurality of third electrodes and the plurality of fourth electrodes are alternately arranged in a first direction and a second direction intersecting the first direction.

3. The semiconductor device of claim 2, further comprising:
   first lines extending in a third direction intersecting the first direction and the second direction, the first lines each electrically connecting third electrodes from the plurality of third electrodes arranged in the third direction; and
   second lines extending in the third direction, the second lines each electrically connecting fourth electrodes from the plurality of fourth electrodes arranged in the third direction.

4. The semiconductor device of claim 1, further comprising a capacitor configured with a first capacitor electrode including first electrodes from the plurality of first electrodes and third electrodes from the plurality of third electrodes, which are electrically connected to each other, and a second capacitor electrode including second electrodes from the plurality of second electrodes and fourth electrodes from the plurality of fourth electrodes, which are electrically connected to each other.

5. The semiconductor device of claim 1, further comprising a capping layer interposed between the first insulating layer and the first high dielectric constant layer.

6. The semiconductor device of claim 1, further comprising:
   a second high dielectric constant layer located on the first high dielectric constant layer, the second high dielectric constant layer having a dielectric constant higher than the dielectric constant of the first insulating layer;
   a plurality of fifth electrodes penetrating the second high dielectric constant layer, the plurality of fifth electrodes being respectively connected to the plurality of third electrodes; and
   a plurality of sixth electrodes penetrating the second high dielectric constant layer, the plurality of sixth electrodes being respectively connected to the plurality of fourth electrodes.

7. The semiconductor device of claim 1, further comprising a substrate including a plurality of first active regions which are connected to the plurality of first electrodes and include a first-type impurity and a plurality of second active regions which are connected to the plurality of second electrodes and include a second-type impurity.

8. The semiconductor device of claim 7,
   wherein the plurality of first active regions include an N-type impurity, and the plurality of second active regions include a P-type impurity.

9. The semiconductor device of claim 7,
   wherein the plurality of first electrodes and the plurality of second electrodes are alternately arranged along a first direction and a second direction intersecting the first direction, and
   wherein each of the plurality of first active regions and the plurality of second active regions extends in a third direction intersecting the first direction and the second direction.

10. The semiconductor device of claim 1, further comprising:
    a substrate located on a bottom of the first insulating layer;
    a gate electrode located between the substrate and the plurality of first electrodes, the gate electrode electrically connecting the plurality of first electrodes; and a junction formed in the substrate, the junction being electrically connected to the plurality of second electrodes.

11. The semiconductor device of claim 10, further comprising a capacitor configured with a first capacitor electrode including the gate electrode, the plurality of first electrodes, and the plurality of third electrodes, which are electrically connected to each other, and a second capacitor electrode including the junction, the plurality of second electrodes, and the plurality of fourth electrodes, which are electrically connected to each other.

12. The semiconductor device of claim 10, further comprising:
   a second high dielectric constant layer located on the first high dielectric constant layer, the second high dielectric constant layer having a dielectric constant higher than the dielectric constant of the first insulating layer;
   a plurality of fifth electrodes penetrating the second high dielectric constant layer, the plurality of fifth electrodes being connected to the plurality of third electrodes; and
   a plurality of sixth electrodes penetrating the second high dielectric constant layer, the plurality of sixth electrodes being connected to the plurality of fourth electrodes.

13. The semiconductor device of claim 12, further comprising:
   a second insulating layer located on the first insulating layer, the second insulating layer surrounding a sidewall of the first high dielectric constant layer;
   a third insulating layer located on the second insulating layer, the third insulating layer surrounding a sidewall of the second high dielectric constant layer;
   a plurality of seventh electrodes penetrating the second insulating layer, the plurality of seventh electrodes being connected to the plurality of second electrodes; and
   a plurality of eighth electrodes penetrating the third insulating layer, the plurality of eighth electrodes being connected to the plurality of seventh electrodes.

14. The semiconductor device of claim 13, further comprising a capacitor configured with a first capacitor electrode including the plurality of first electrodes, the plurality of third electrodes, and the plurality of fifth electrodes, which are electrically connected to each other, and a second capacitor electrode including the plurality of second electrodes, the plurality of seventh electrodes, the plurality of eighth electrodes, the plurality of fourth electrodes, and the plurality of sixth electrodes, which are electrically connected to each other.

15. A semiconductor device comprising:
   a first high dielectric constant layer;
   a plurality of first electrodes penetrating the first high dielectric constant layer;
   a plurality of second electrodes penetrating the first high dielectric constant layer to a depth different from that of the plurality of first electrodes;
   a second high dielectric constant layer located on the first high dielectric constant layer;
   a plurality of third electrodes penetrating the second high dielectric constant layer, the plurality of third electrodes being electrically connected to the second electrodes; and
   a plurality of fourth electrodes penetrating the second high dielectric constant layer to a depth different from that of the plurality of third electrodes, the plurality of fourth electrodes being spaced apart from the plurality of first electrodes.

16. The semiconductor device of claim 15,
   wherein the plurality of first electrodes are arranged in a first direction and a second direction intersecting the first direction, and
   wherein the plurality of second electrodes extend in the first direction.

17. The semiconductor device of claim 16,
   wherein the plurality of third electrodes are arranged in the first direction and the second direction, and each of the plurality of second electrodes respectively connects third electrodes, from the plurality of third electrodes, arranged in the first direction.

18. The semiconductor device of claim 15, further comprising:
   an insulating layer located on a bottom of the first high dielectric constant layer; and
   a plurality of fifth electrodes partially penetrating the insulating layer, the plurality of fifth electrodes being connected to the plurality of first electrodes.

19. The semiconductor device of claim 18,
   wherein each of the plurality of fifth electrodes extends in a first direction, and respectively connects first electrodes, from the plurality of first electrodes, arranged in the first direction.

20. A semiconductor device comprising:
   a first insulating layer;
   a first electrode penetrating the first insulating layer;
   a second electrode penetrating the first insulating layer, the second electrode being adjacent to the first electrode;
   a capping layer over the first insulating layer;
   a first high dielectric constant layer having a dielectric constant higher than a dielectric constant of the first insulating layer, wherein the first high dielectric constant layer is located over the capping layer;
   a third electrode penetrating the first high dielectric constant layer and the capping layer, the third electrode being connected to the first electrode; and
   a fourth electrode penetrating the first high dielectric constant layer and the capping layer, the fourth electrode being located adjacent to the third electrode.

* * * * *